US012690215B2

(12) United States Patent
Chiang et al.

(10) Patent No.: US 12,690,215 B2
(45) Date of Patent: Jul. 21, 2026

(54) FIELD EFFECT TRANSISTOR WITH GATE ISOLATION STRUCTURE AND METHOD

(71) Applicant: Taiwan Semiconductor Manufacturing Co., Ltd., Hsinchu (TW)

(72) Inventors: Kuo-Cheng Chiang, Hsinchu (TW); Guan-Lin Chen, Hsinchu (TW); Shi Ning Ju, Hsinchu (TW); Jung-Chien Cheng, Hsinchu (TW); Chih-Hao Wang, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 515 days.

(21) Appl. No.: 18/163,857

(22) Filed: Feb. 2, 2023

(65) Prior Publication Data

US 2023/0402536 A1 Dec. 14, 2023

Related U.S. Application Data

(60) Provisional application No. 63/409,175, filed on Sep. 22, 2022, provisional application No. 63/350,147, filed on Jun. 8, 2022.

(51) Int. Cl.
| | |
|---|---|
| *H10D 30/43* | (2025.01) |
| *H10D 30/01* | (2025.01) |
| *H10D 30/67* | (2025.01) |
| *H10D 62/10* | (2025.01) |
| *H10D 62/13* | (2025.01) |

(52) U.S. Cl.
CPC ........... *H10D 30/43* (2025.01); *H10D 30/014* (2025.01); *H10D 30/6735* (2025.01); *H10D 62/121* (2025.01); *H10D 62/151* (2025.01)

(58) Field of Classification Search
CPC ............. H10D 30/6735; H10D 62/121; H10D 64/017; H10D 30/031; H01L 21/28123
See application file for complete search history.

(56) References Cited

U.S. PATENT DOCUMENTS

| | | | |
|---|---|---|---|
| 9,236,267 | B2 | 1/2016 | De et al. |
| 9,502,265 | B1 | 11/2016 | Jiang et al. |
| 9,520,466 | B2 | 12/2016 | Holland et al. |
| 9,520,482 | B1 | 12/2016 | Chang et al. |

(Continued)

FOREIGN PATENT DOCUMENTS

| | | |
|---|---|---|
| TW | 201344909 A | 11/2013 |
| TW | 202114065 A | 4/2021 |
| TW | 202213633 A | 4/2022 |

*Primary Examiner* — Brian Turner
(74) *Attorney, Agent, or Firm* — Seed IP Law Group

(57) ABSTRACT

A device includes a first vertical stack of first nanostructures formed over a substrate, a second vertical stack of second nanostructures adjacent to the first vertical stack, and a first gate structure adjacent the first nanostructures. The first gate structure includes a first gate portion between the first nanostructures, and a second gate portion extending from a first sidewall of the first gate portion to a second sidewall of the first gate portion. The second sidewall is between the first sidewall and the substrate, and is a different material than the first gate portion. A second gate structure is adjacent the second nanostructures, and a second wall structure is between the second gate portion and the second gate structure.

20 Claims, 26 Drawing Sheets

(56)         References Cited

U.S. PATENT DOCUMENTS

| | | | |
|---|---|---|---|
| 9,536,738 B2 | 1/2017 | Huang et al. | |
| 9,576,814 B2 | 2/2017 | Wu et al. | |
| 9,608,116 B2 | 3/2017 | Ching et al. | |
| 9,786,774 B2 | 10/2017 | Colinge et al. | |
| 9,853,101 B2 | 12/2017 | Peng et al. | |
| 9,881,993 B2 | 1/2018 | Ching et al. | |
| 10,103,065 B1 | 10/2018 | Mochizuki et al. | |
| 2019/0172828 A1 | 6/2019 | Smith et al. | |
| 2019/0348530 A1* | 11/2019 | Ando | H10D 86/431 |
| 2021/0083072 A1* | 3/2021 | Feng | H10D 84/038 |
| 2021/0098455 A1* | 4/2021 | Yu | H10D 84/0177 |
| 2021/0125875 A1* | 4/2021 | Tsai | H10D 84/038 |
| 2021/0126018 A1 | 4/2021 | Zhang et al. | |
| 2021/0265223 A1* | 8/2021 | Yang | H10D 84/038 |
| 2021/0343713 A1 | 11/2021 | Ju et al. | |
| 2021/0391436 A1 | 12/2021 | Lee et al. | |
| 2022/0037529 A1 | 2/2022 | Kim et al. | |
| 2022/0045051 A1 | 2/2022 | You et al. | |
| 2022/0173097 A1* | 6/2022 | Yang | H10D 84/834 |
| 2022/0254781 A1* | 8/2022 | Song | H10D 84/85 |

* cited by examiner

FIELD EFFECT TRANSISTOR WITH GATE ISOLATION STRUCTURE AND METHOD

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
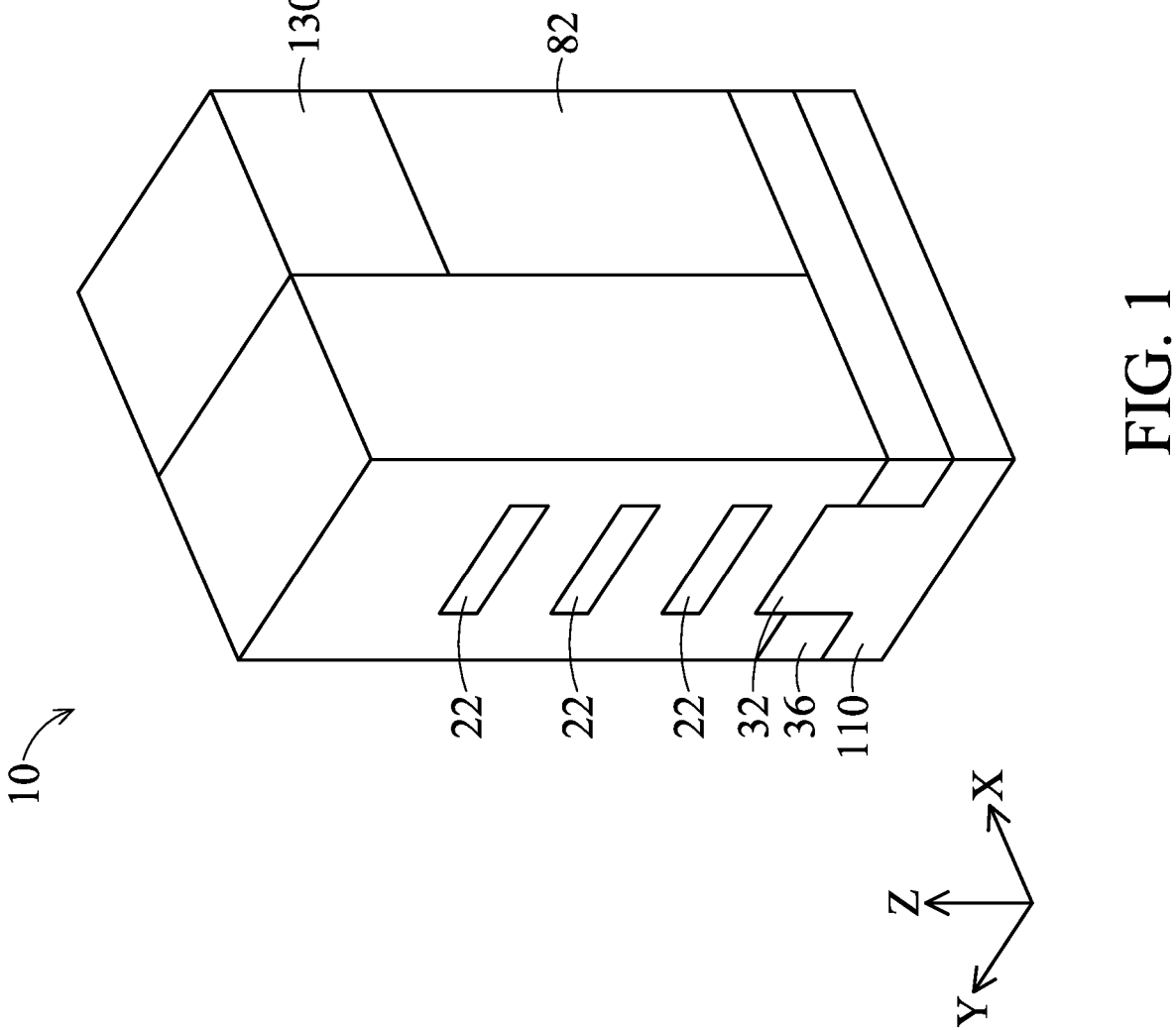
FIG. 1 is a diagrammatic perspective view of a portion of an IC device fabricated according to embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is generally related to semiconductor devices, and more particularly to field-effect transistors (FETs), such as planar FETs, three-dimensional fin FETs (FinFETs), or nanostructure devices. Examples of nanostructure devices include gate-all-around (GAA) devices, nanosheet FETs (NSFETs), nanowire FETs (NWFETs), and the like. In advanced technology nodes, dimension scaling can lead to difficulties forming contacts and vias to the gate, source and drain electrodes of the FETs.

As semiconductor device dimensions are scaled down, active area spacing may be increased due to tolerance for overlap shift when forming a gate isolation structure between neighboring devices. The gate isolation structure physically and electrically isolates a gate structure on one side of the gate isolation structure from another gate structure on an opposing side of the gate isolation structure. To avoid etching into semiconductor channels due to overlap shift, the gate isolation structure may be offset from the semiconductor channels by a selected distance. The portion of the gate structure that extends past the semiconductor channels by the selected distance may be referred to as an endcap. Reducing the endcap is beneficial for reducing area of the nanostructure device and for increasing performance of the nanostructure device. Presence of the endcap is beneficial for achieve a selected threshold voltage.

In embodiments of the disclosure, a gate isolation structure that is self-aligned is formed by recessing a first gate metal of the gate structure, selectively growing a second gate metal on the first gate metal, and depositing the gate isolation structure in an opening between the gate structure and a neighboring gate structure thereof. Prior to depositing the first gate metal, an anneal process using oxygen may be performed to increase lateral thickness of an interfacial layer, which allows for reduction in thickness of the second gate metal.

The nanostructure transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the nanostructure transistor structure.

FIG. 1 illustrates a diagrammatic perspective view of a portion of a nanostructure device 10, in accordance with various embodiments. The nanostructure device 10 includes a substrate 110 and a vertical stack of nanostructures 22 (e.g., nanosheets, nanowires, or the like) above the substrate 110. The nanostructures 22 are vertically separated from one another, and may be referred to as channels 22. Source/drain regions 82 are disposed on opposing sides of and abutting the nanostructures 22. A single source/drain region 82 is shown in FIG. 1, and another source/drain region 82 is omitted from view for simplicity of illustration. A gate structure 200 wraps around each of the nanostructures 22 (e.g., a full perimeter of each of the nanostructures 22). Electrical current may flow through the channels 22 between the source/drain regions 82 on either side thereof in response to a voltage potential applied at the gate structure 200. Magnitude of the electrical current may be associated with a difference in voltage at the gate structure 200 and a source region 82 of the source/drain regions 82, also referred to as gate-source voltage VGS for N-type FETs, and as source-gate voltage VSG for P-type FETS.

Isolation regions 36 are formed on opposing sides of a protruded portion (e.g., a fin 32) of the substrate 110, with the nanostructures 22 disposed above the fin 32. An inter-layer dielectric (ILD) 130 is disposed over the source/drain region 82.

The nanostructure device 10 depicted in FIG. 1 is illustrated in a simplified view, and thus, it should be understood that one or more features of a completed nanostructure device may not be shown in FIG. 1. For example, the other source/drain region 82 opposite the gate structure 200 from the source/drain region 82 and the ILD 130 disposed over such a source/drain region 82 are not shown in FIG. 1.

Figure 2A:
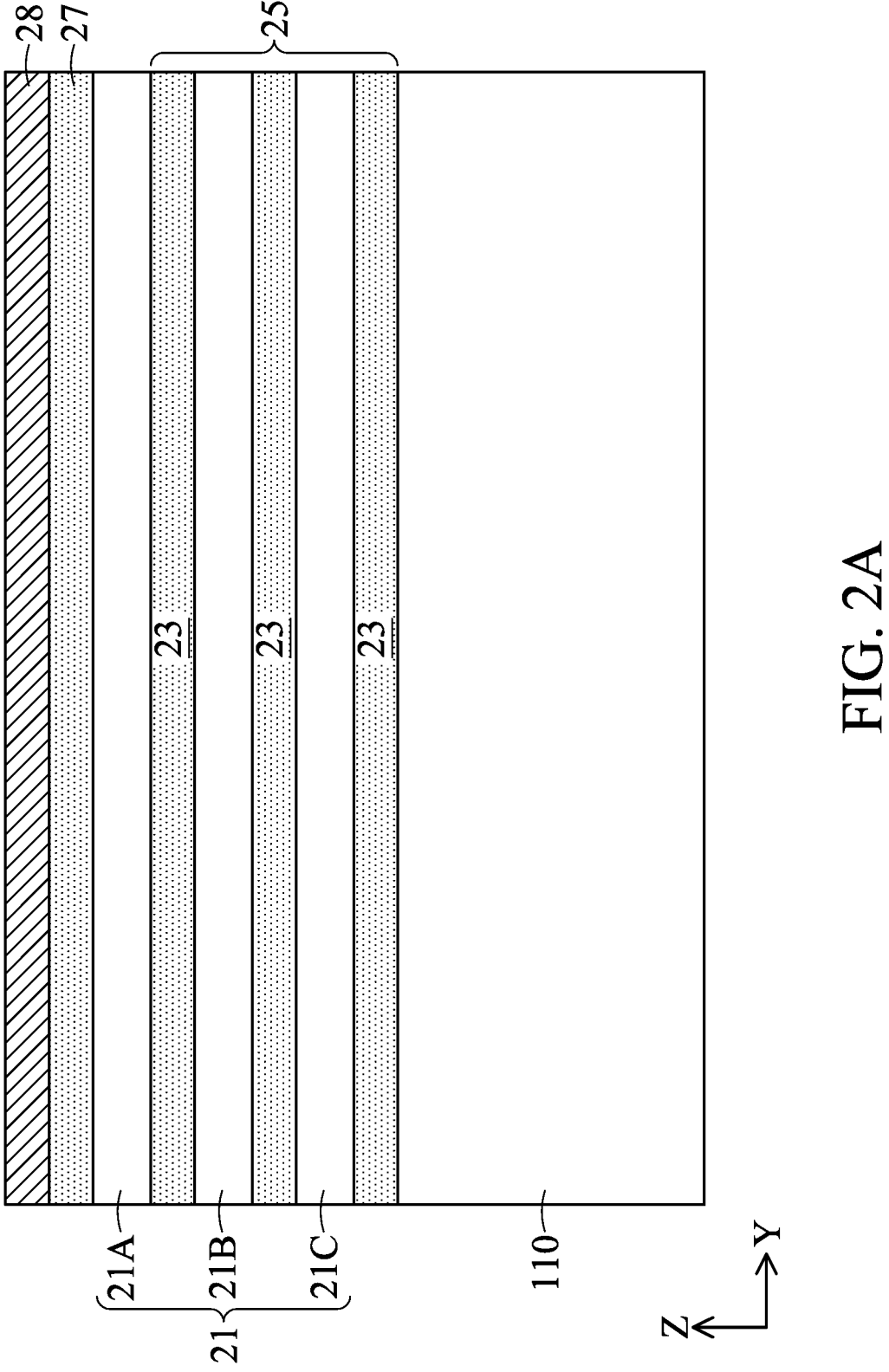
FIGS. 2A-2X are views of various embodiments of an IC device of at various stages of fabrication according to various aspects of the present disclosure.
Figure 2B:
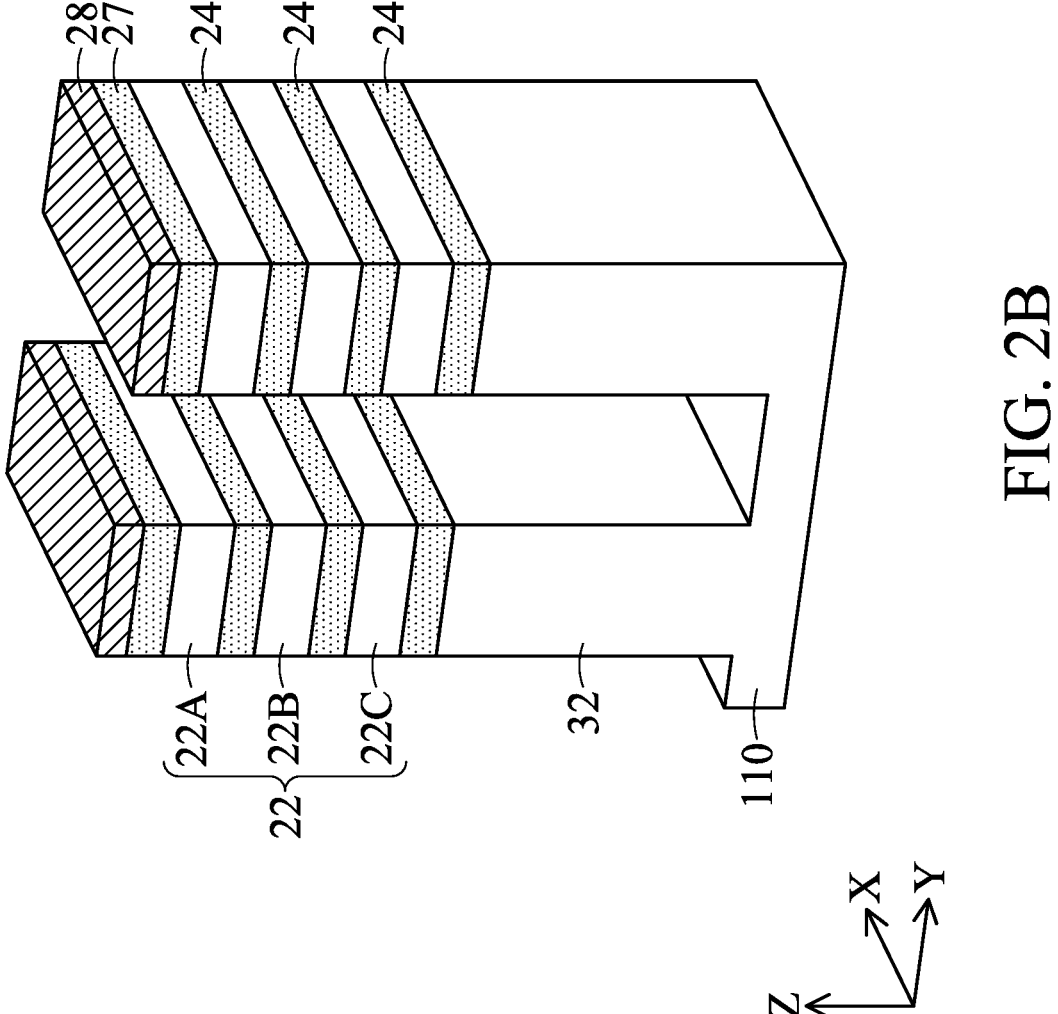
Figure 2C:
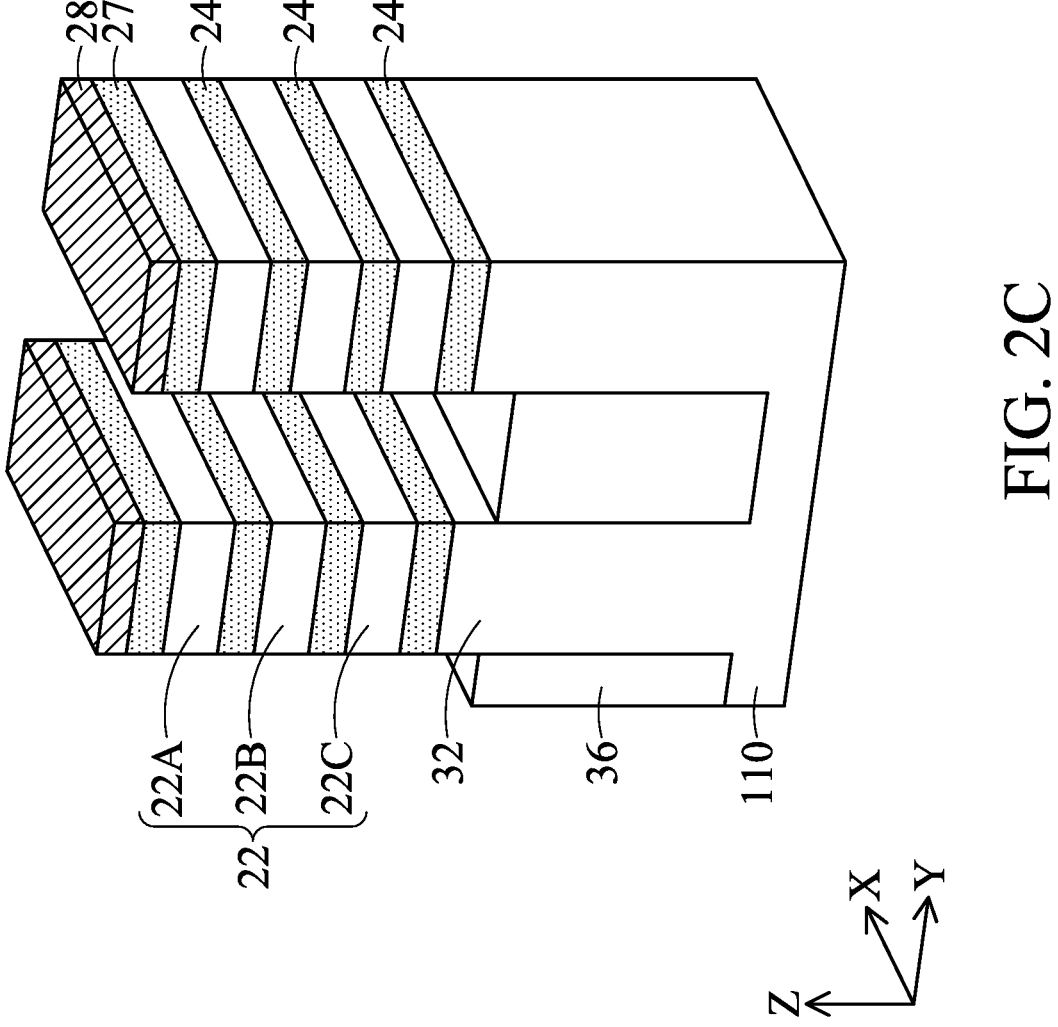
Figure 2D:
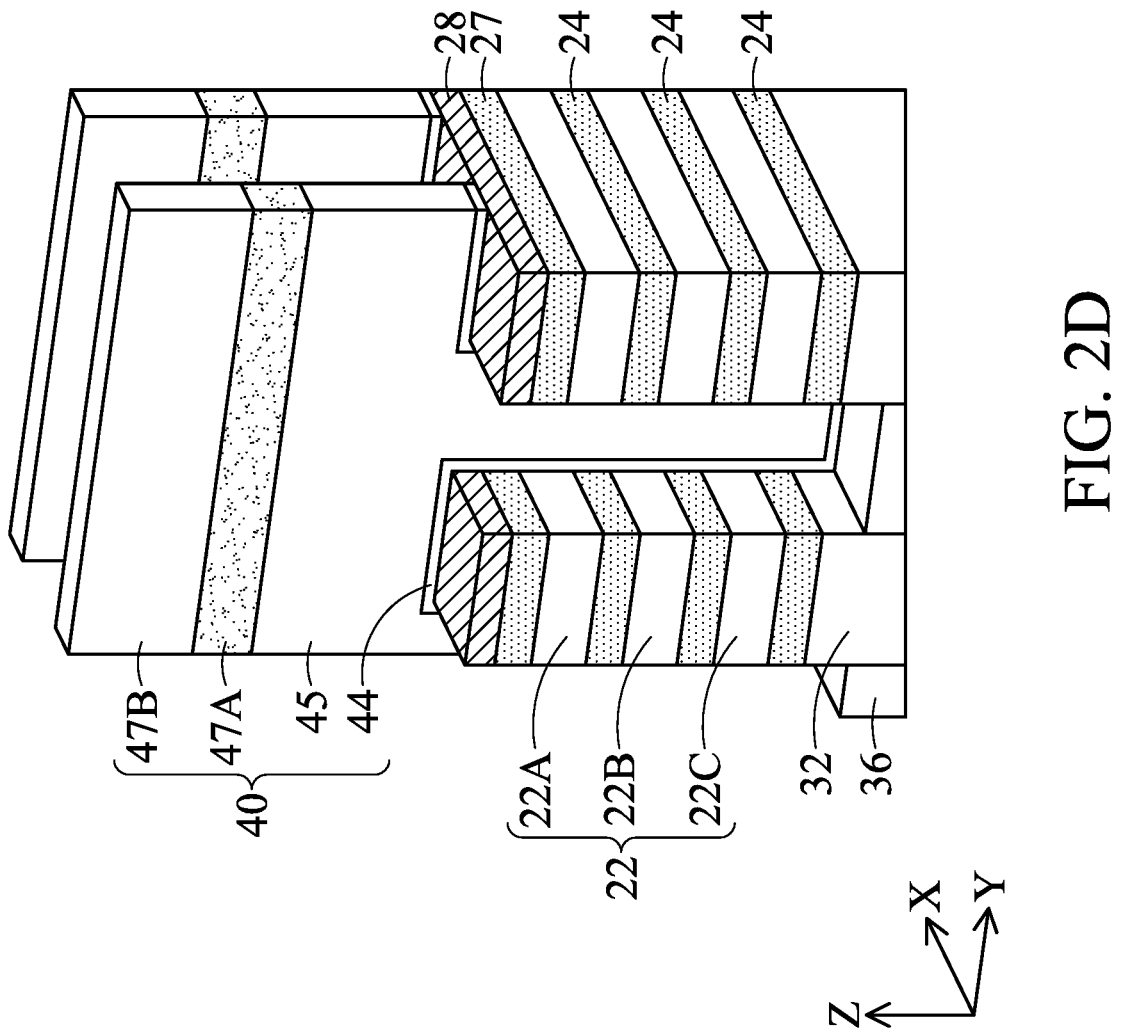
Figure 2E:
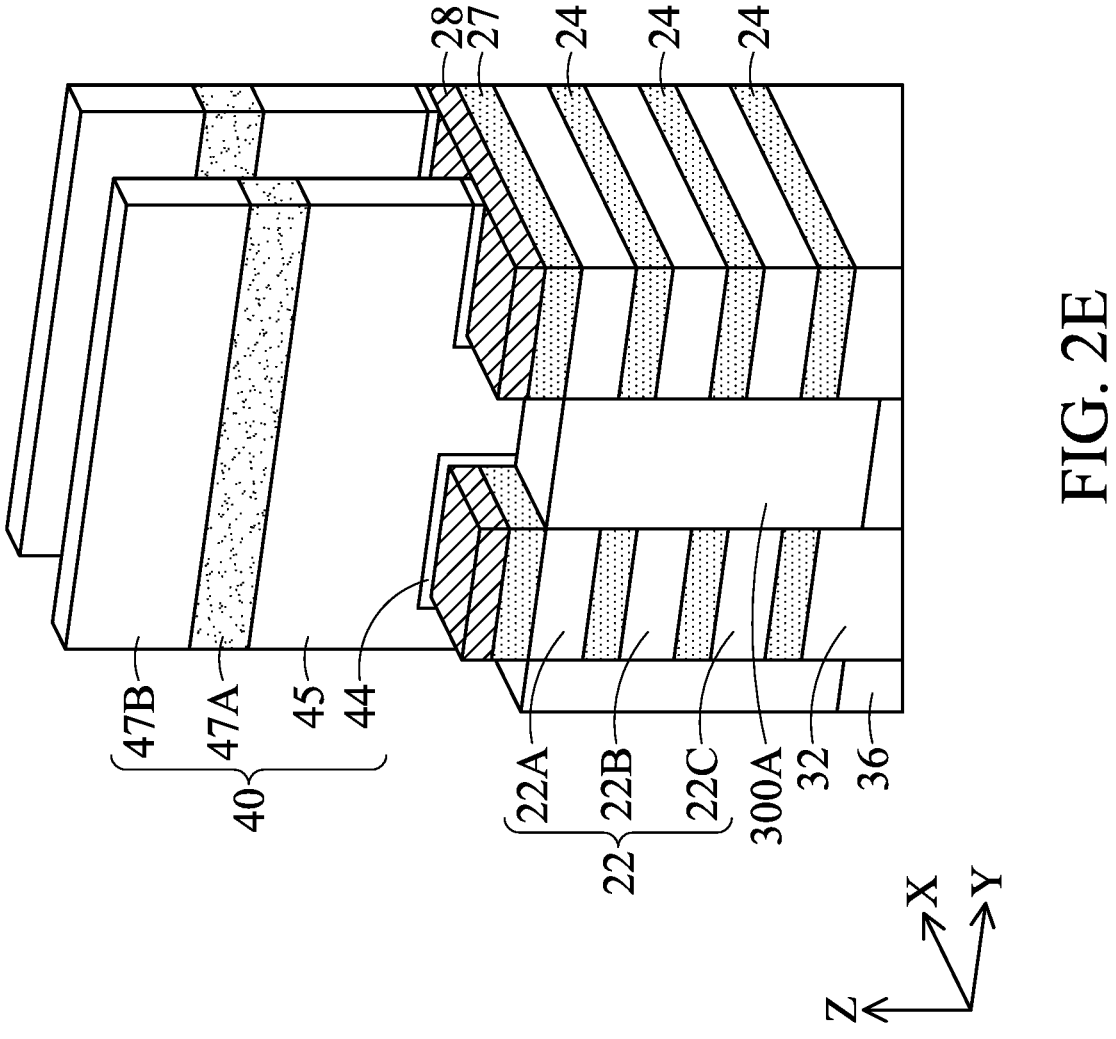
Figure 2F:
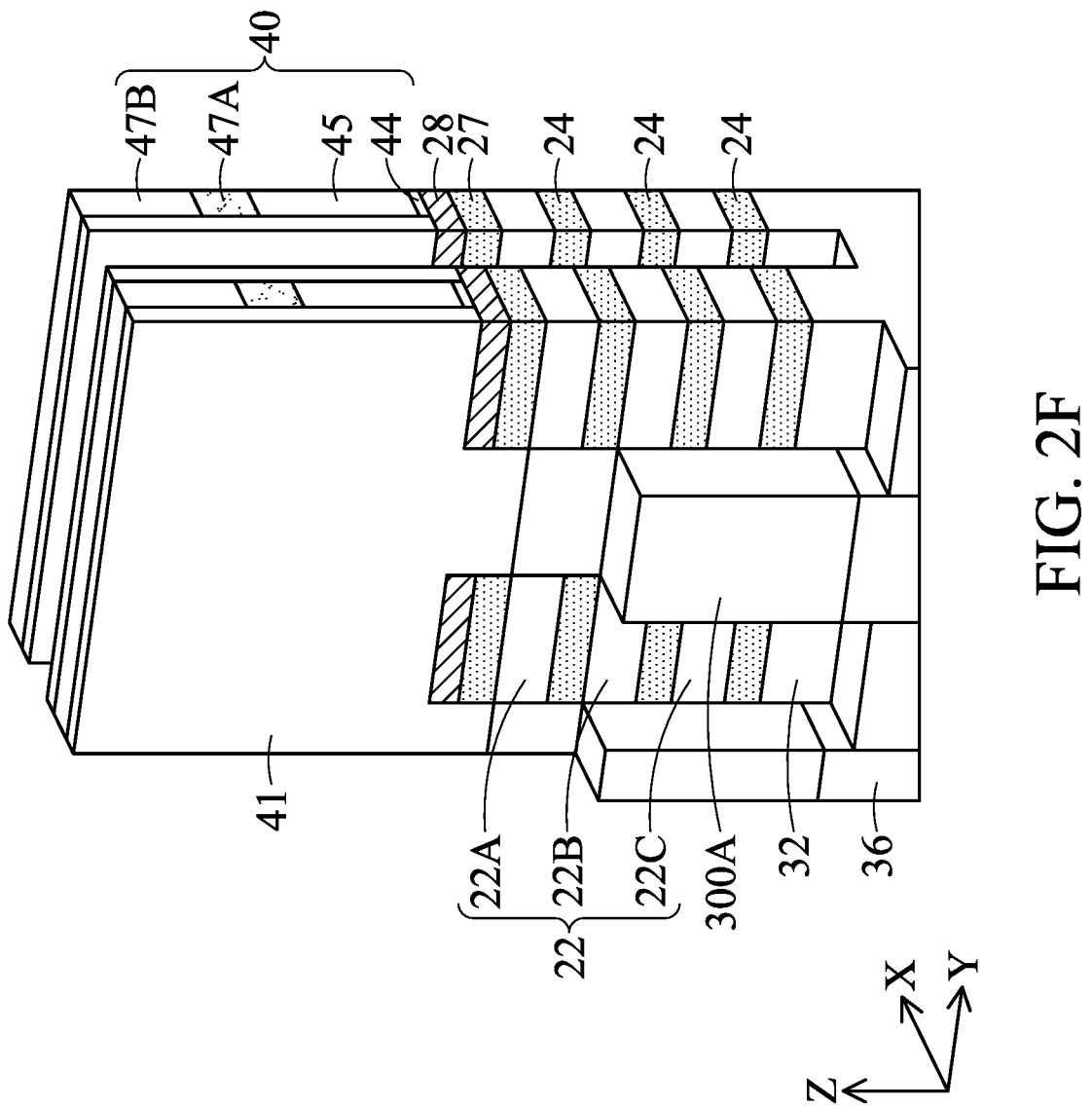
Figure 2G:
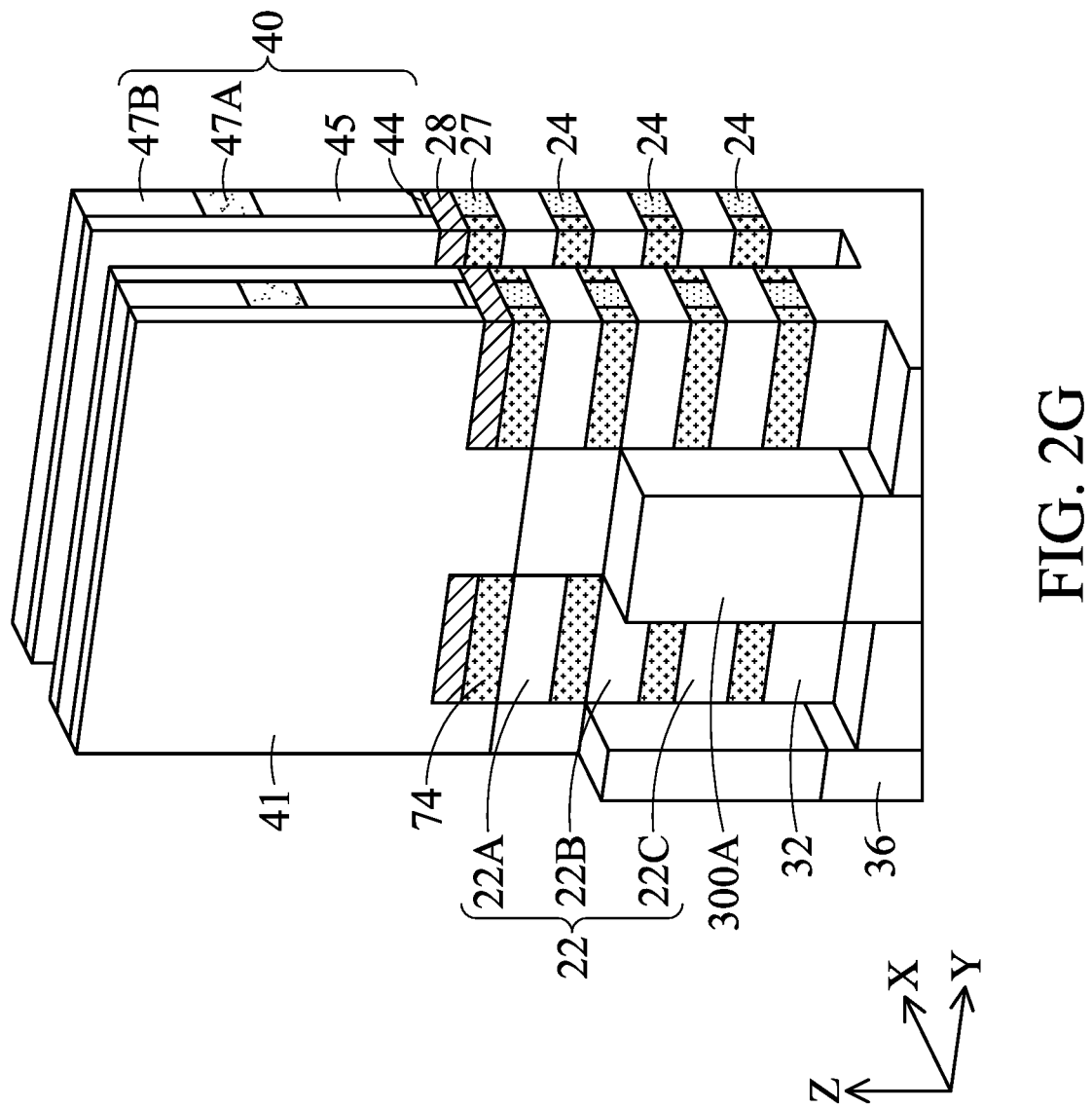
Figure 2H:
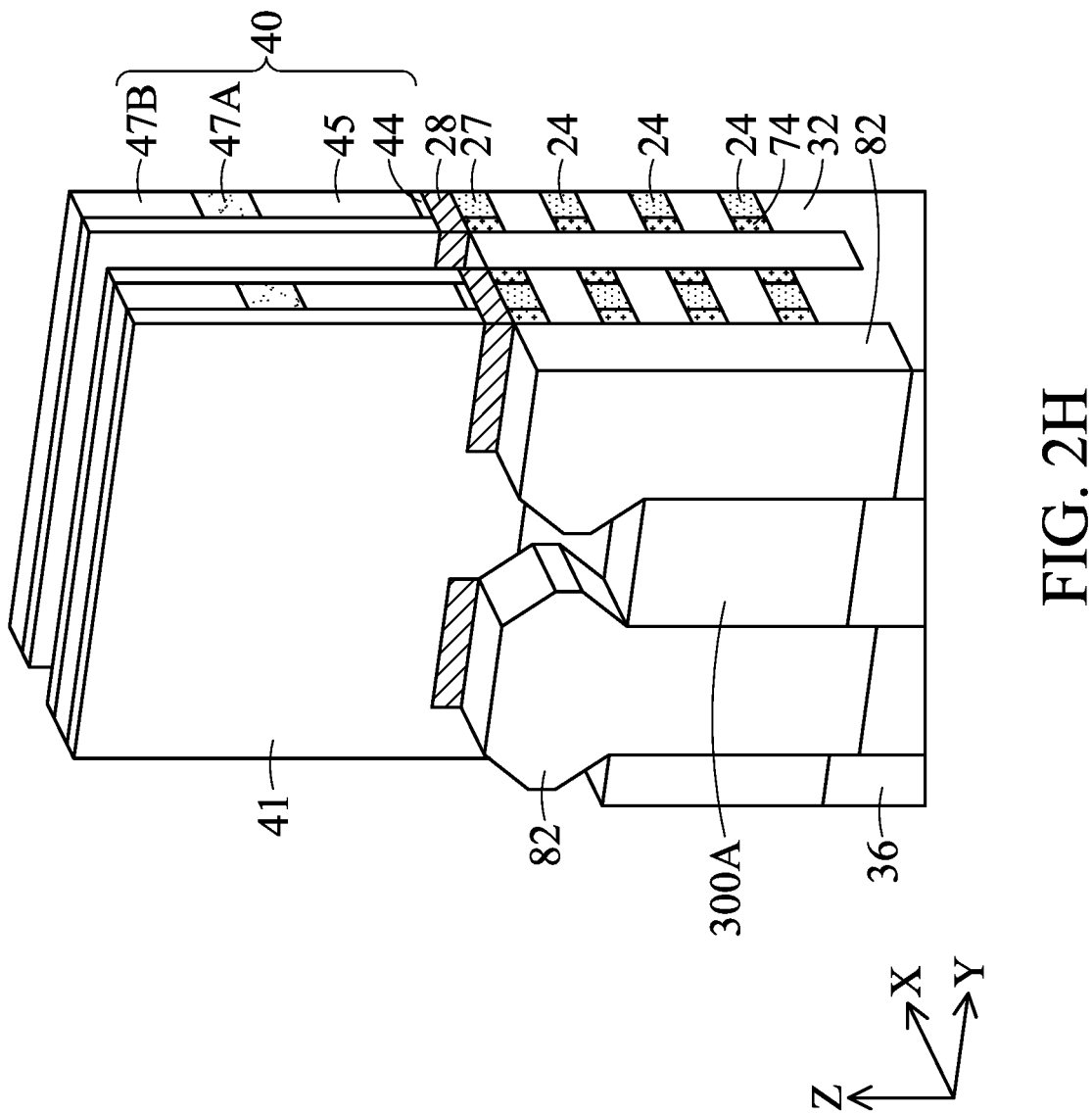
Figure 2I:
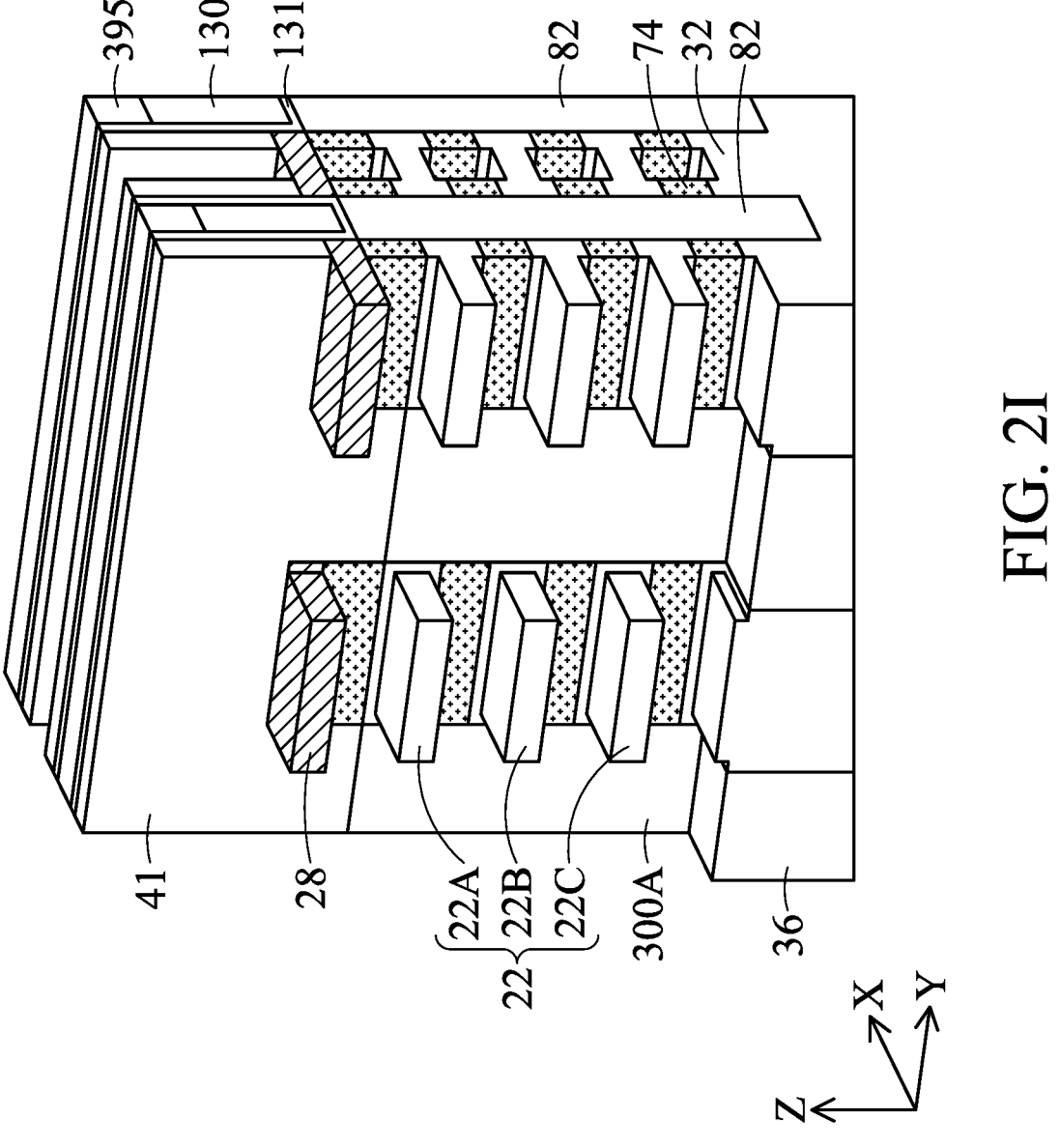
Figure 2J:
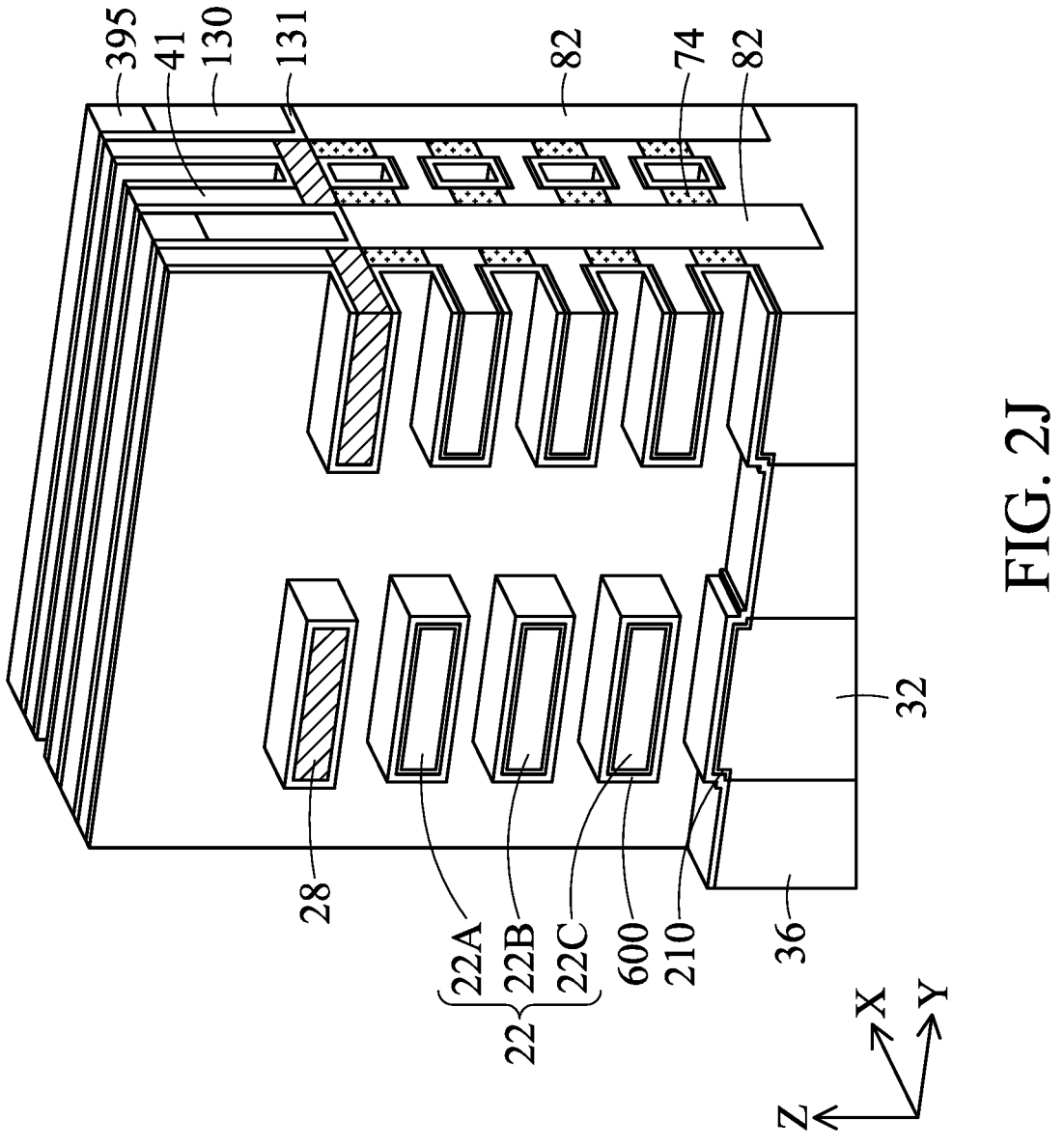
Figure 2K:
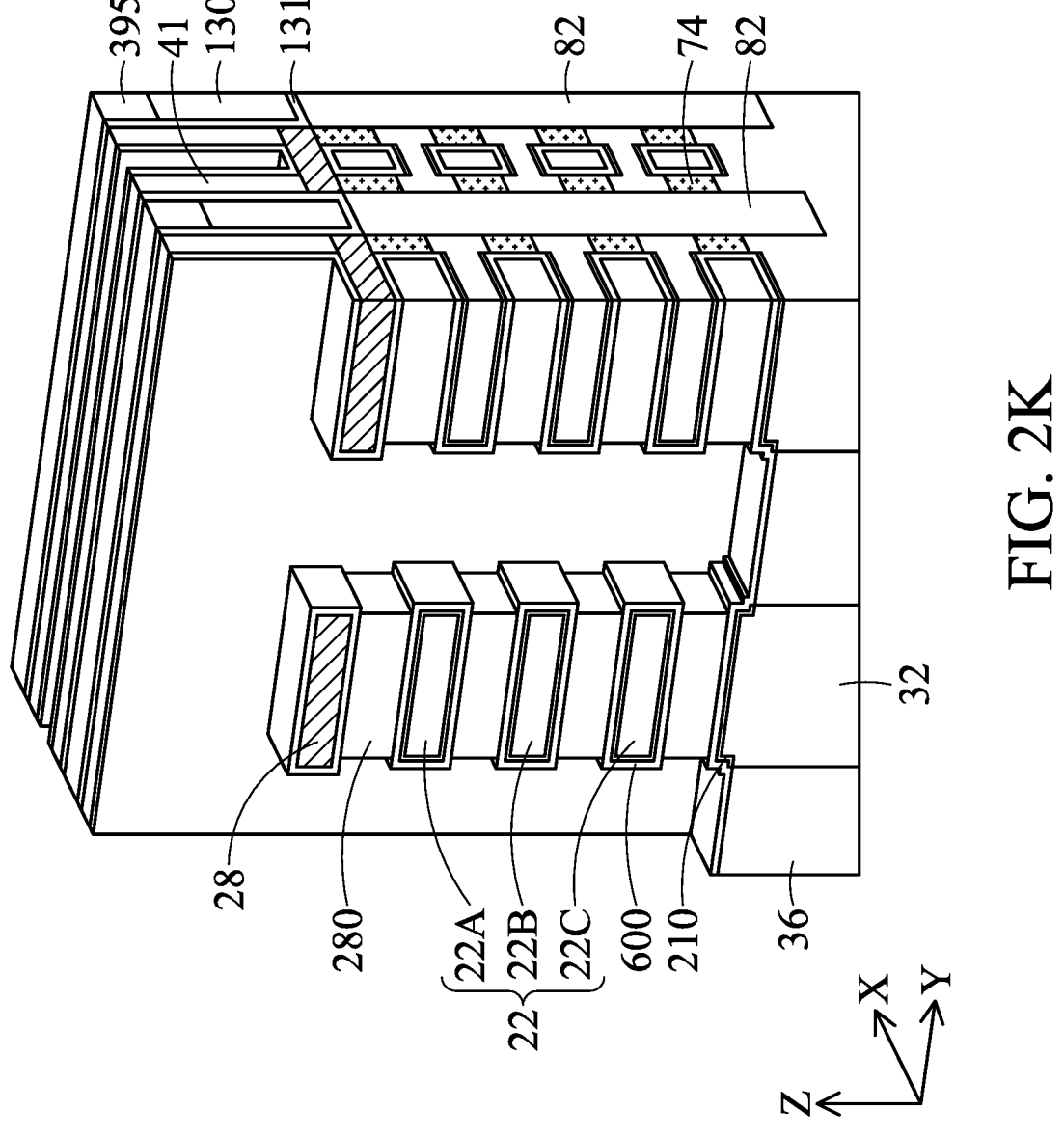
Figure 2L:
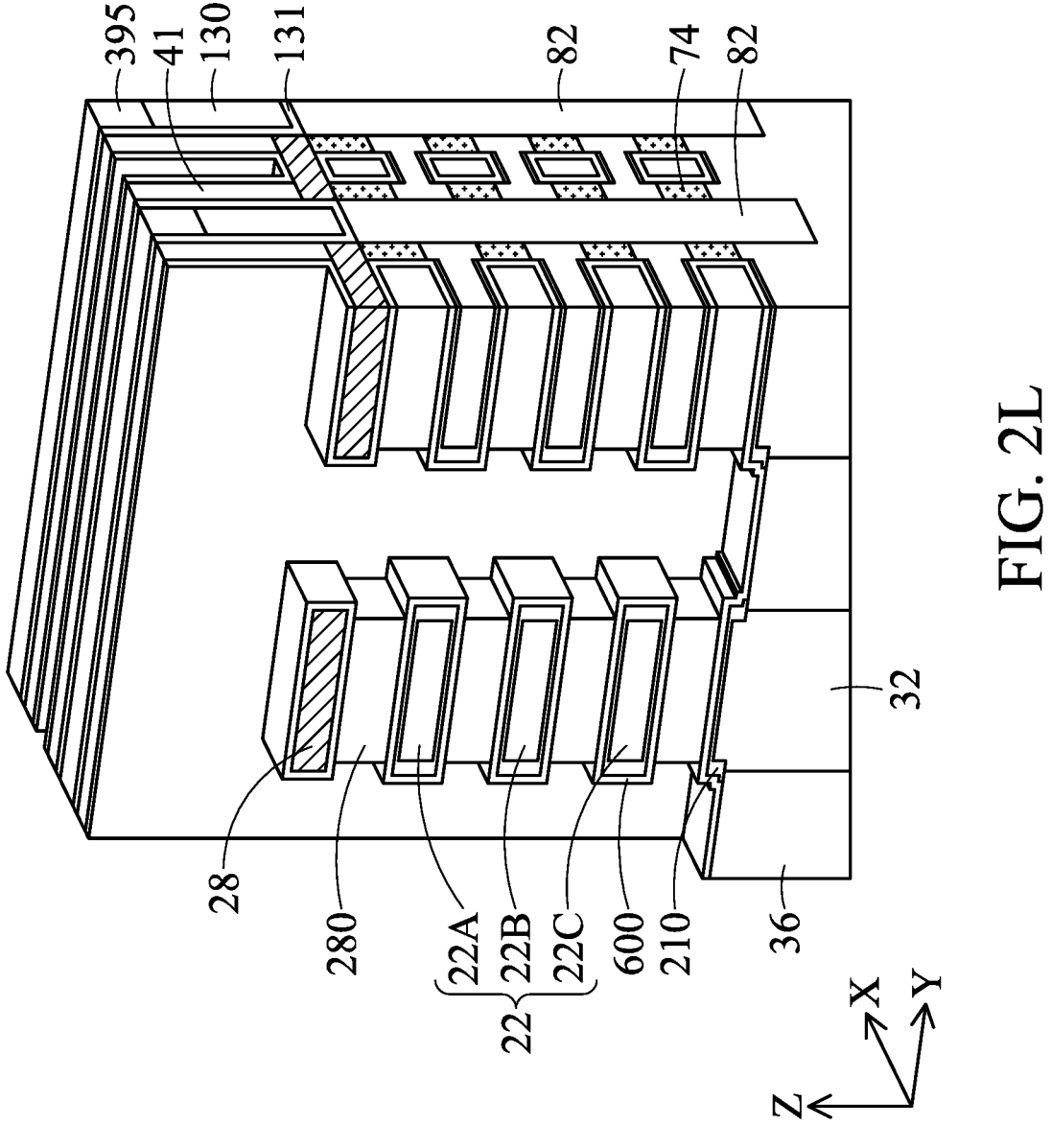
Figure 2M:
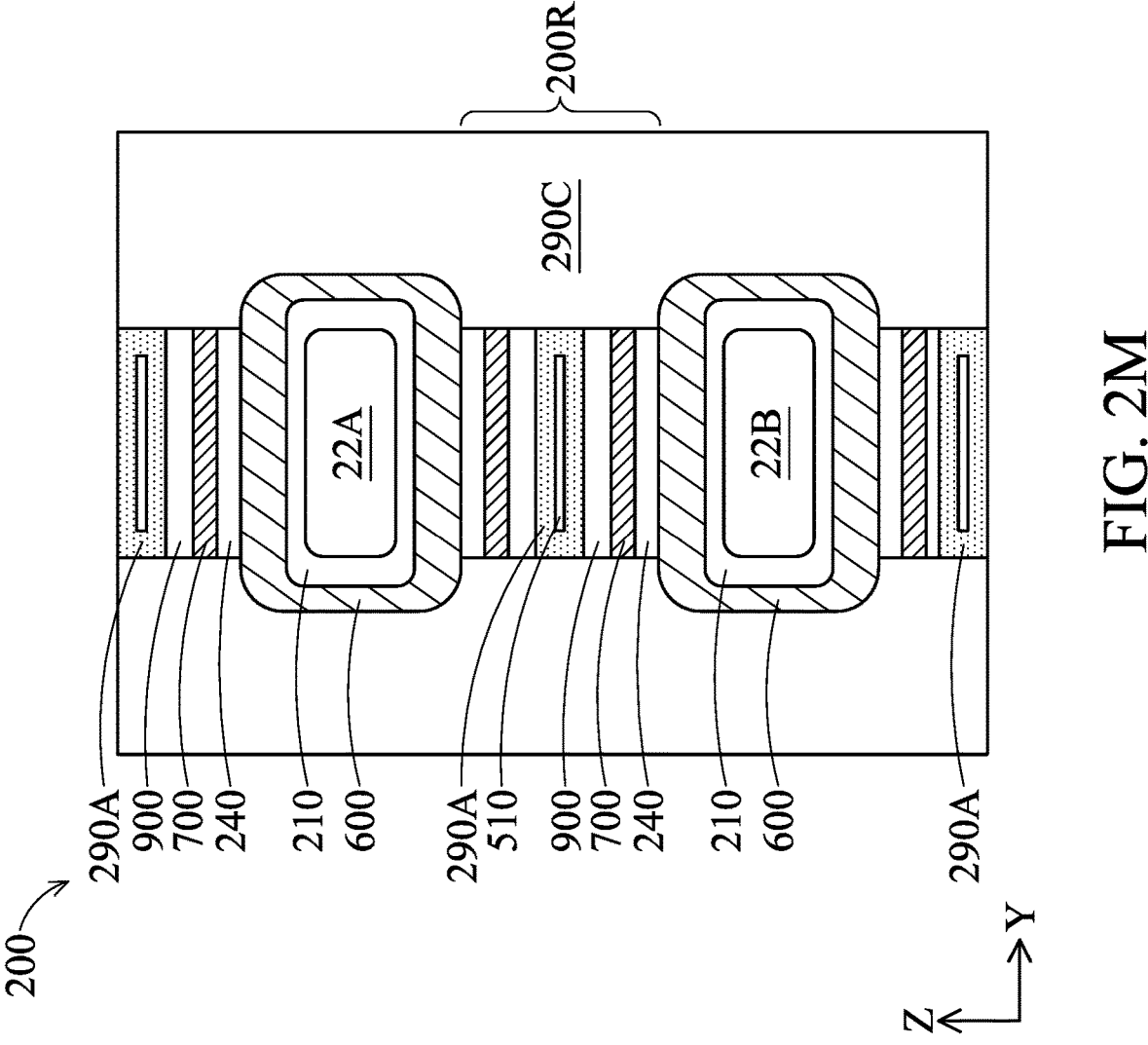
Figure 2N:
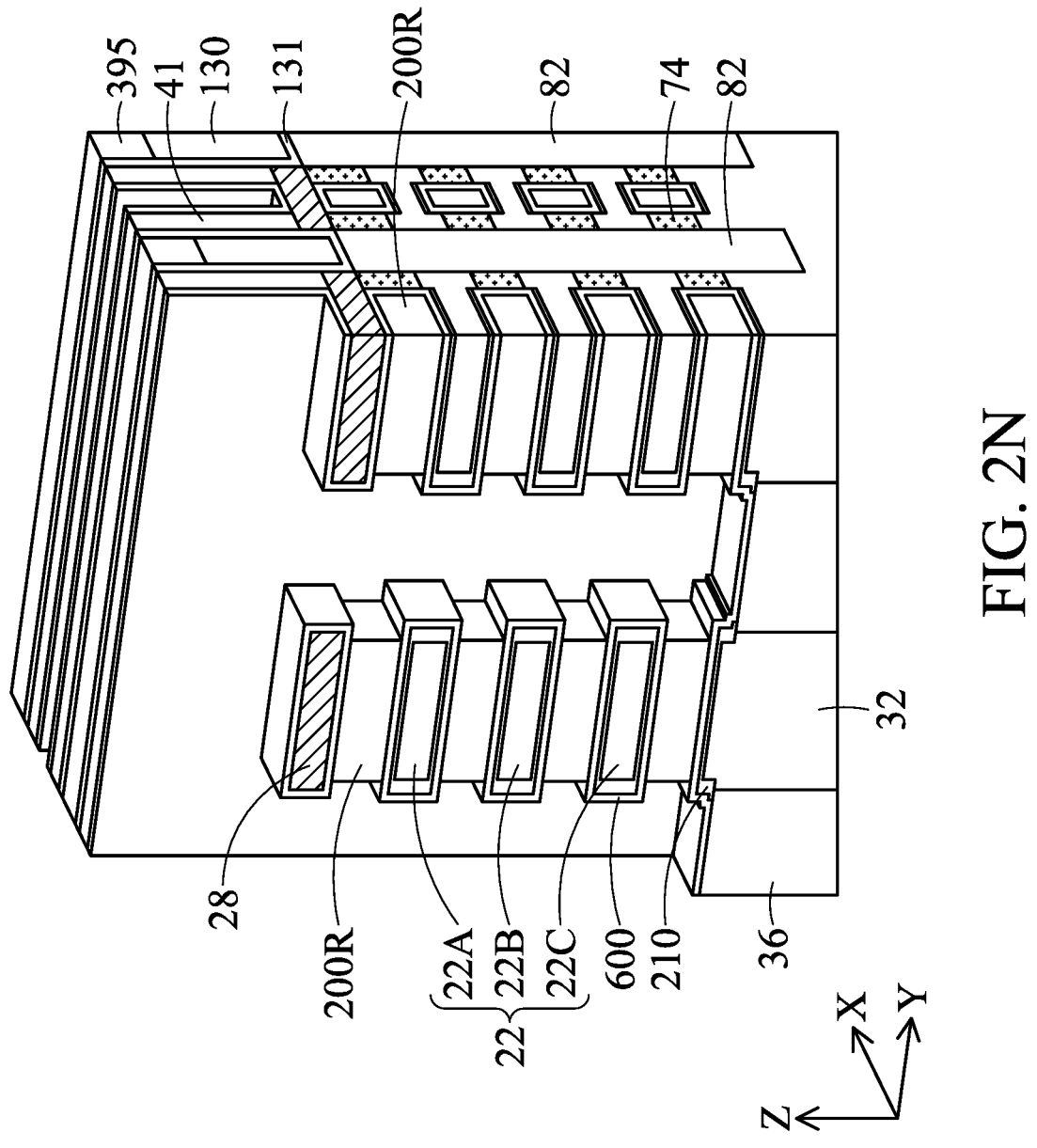
Figure 2O:
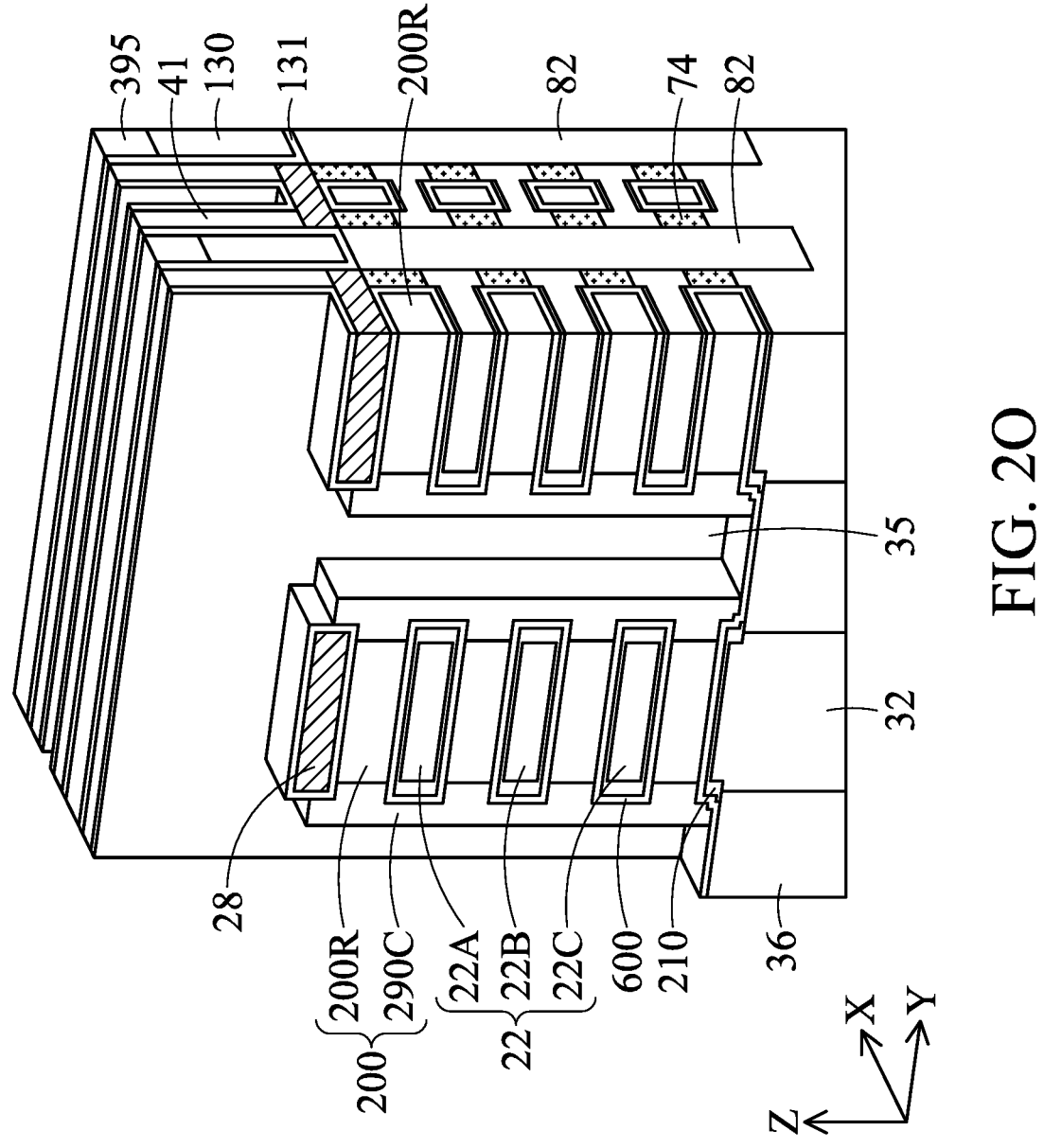
Figure 2P:
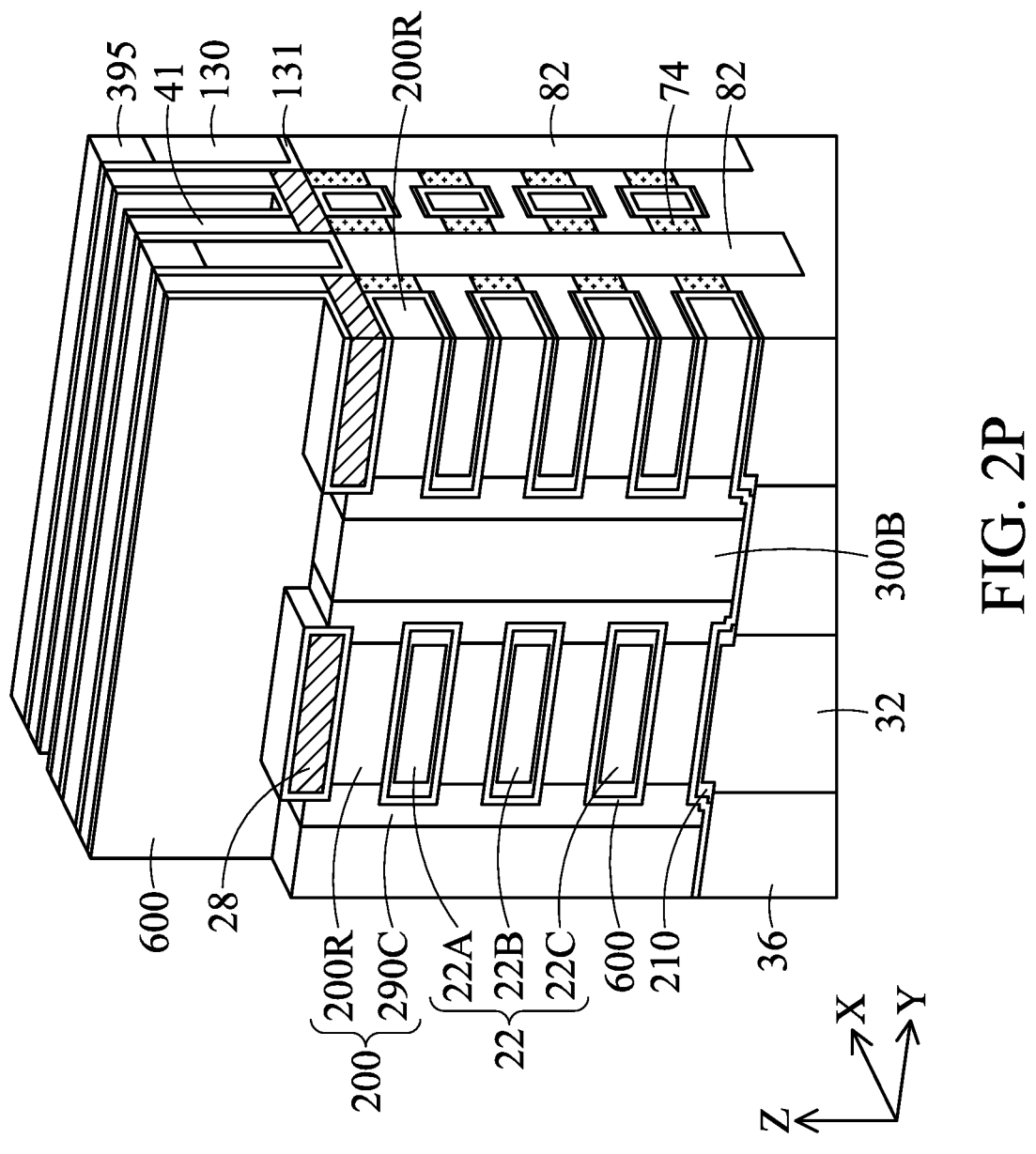
Figure 2Q:
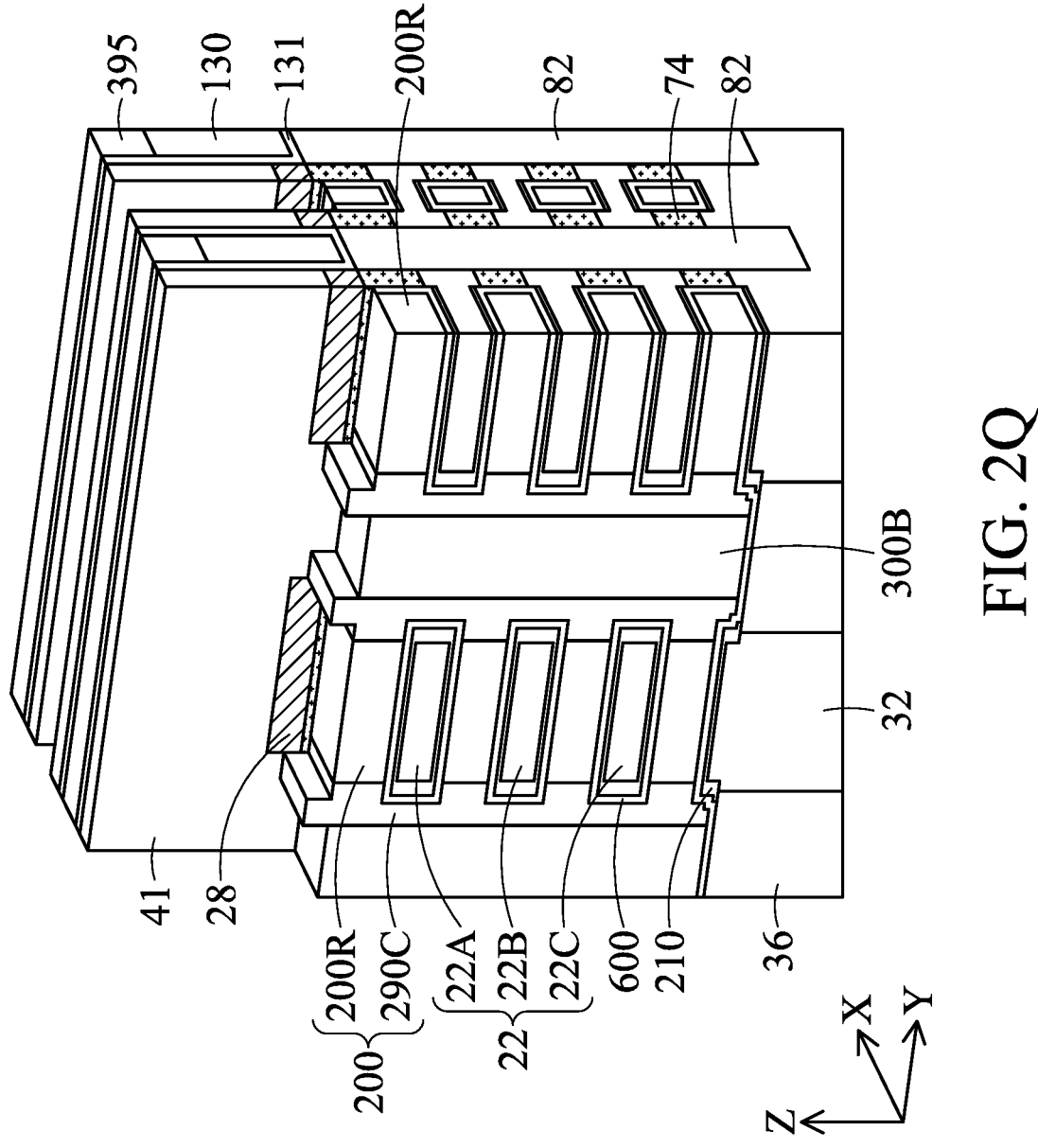
Figure 2R:
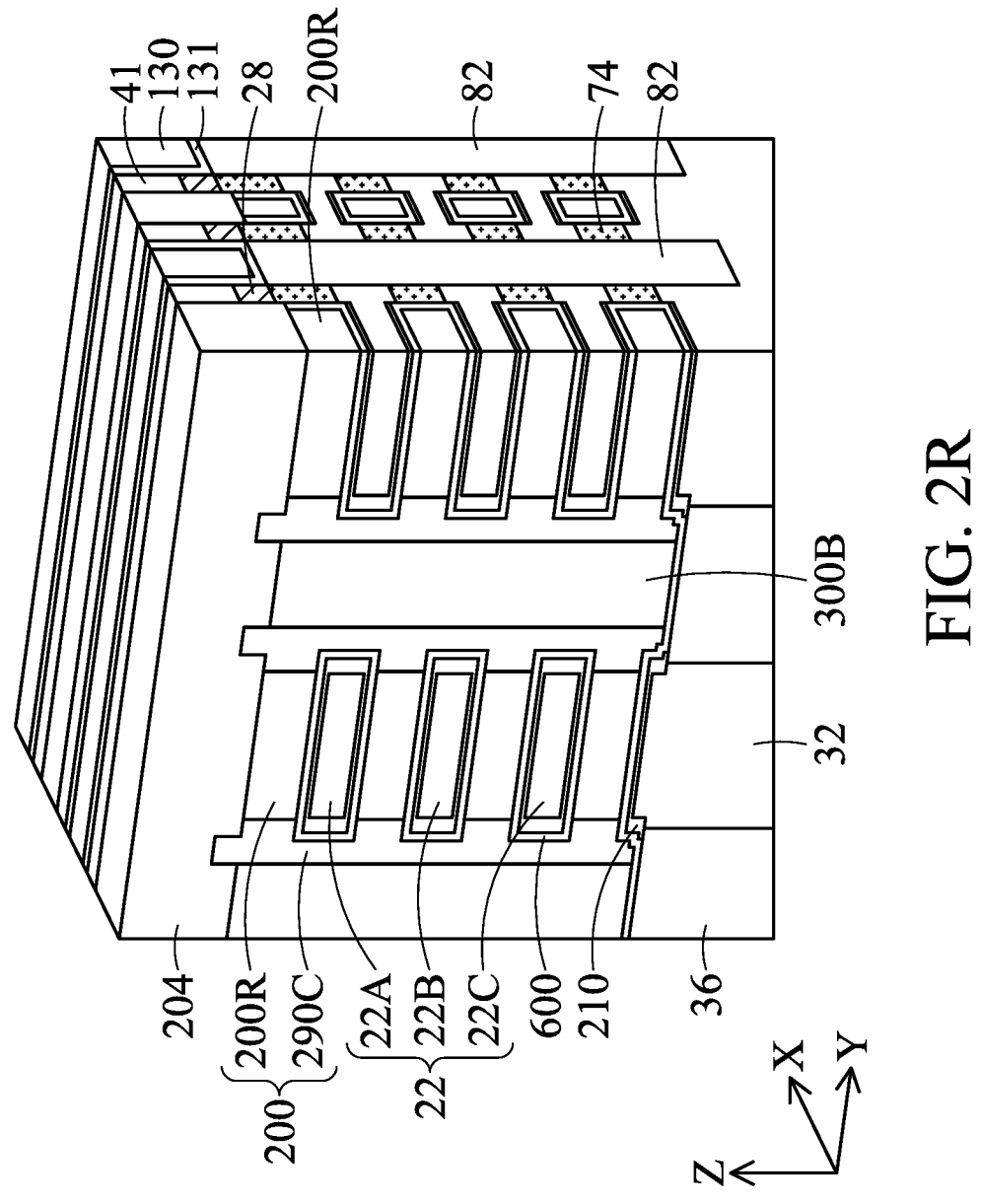
Figure 2S:
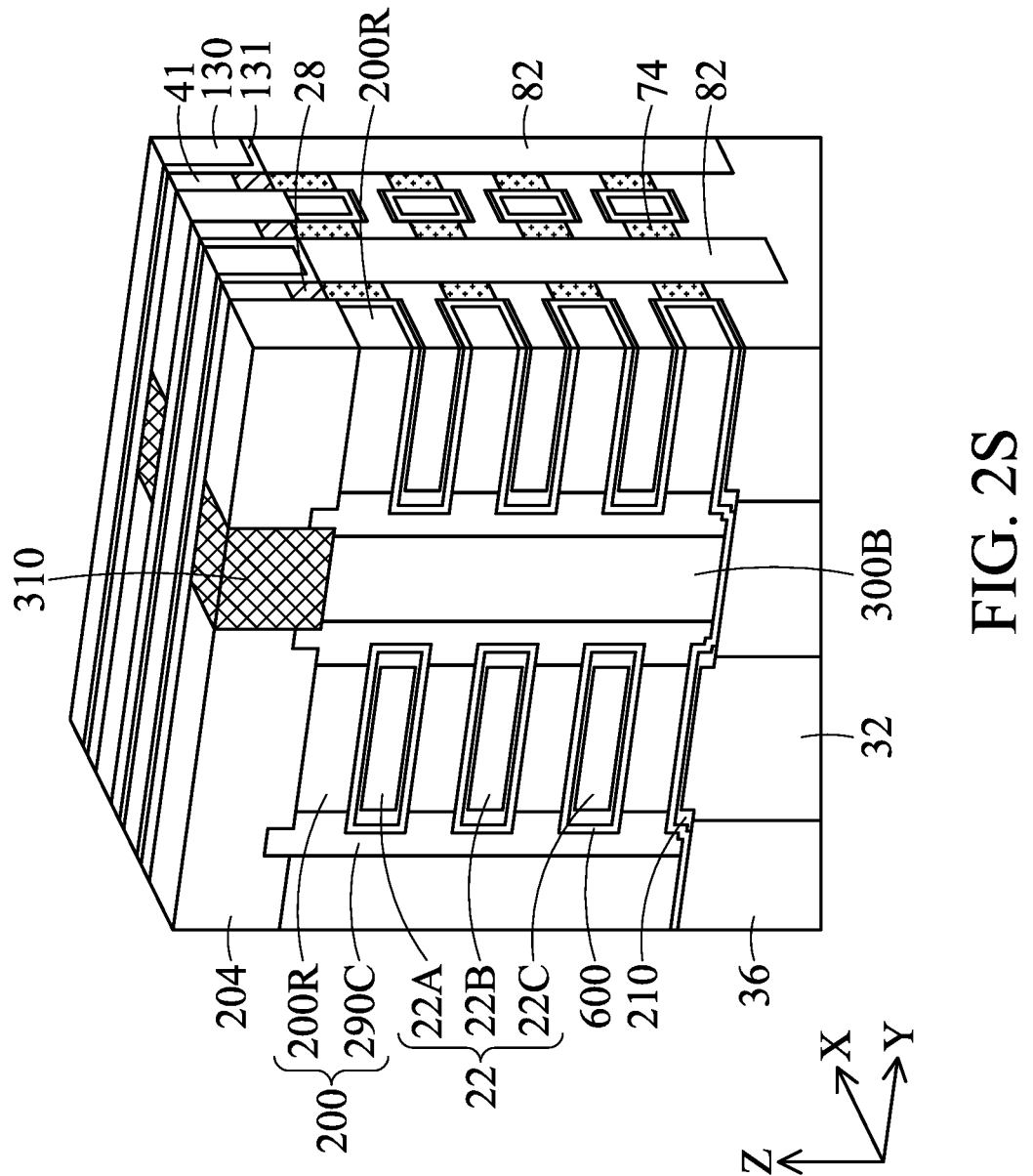
Figure 2T:
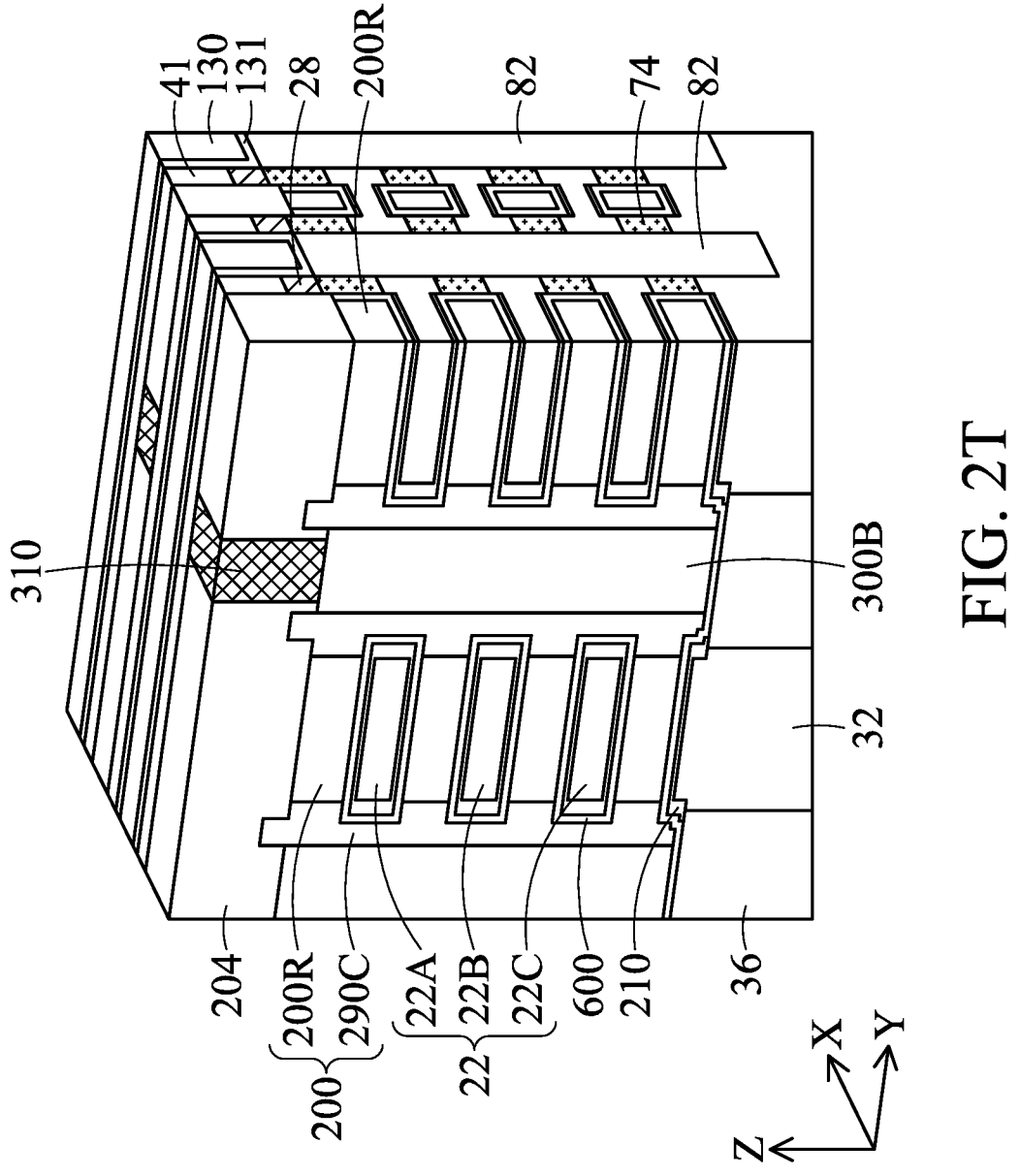
Figure 2U:
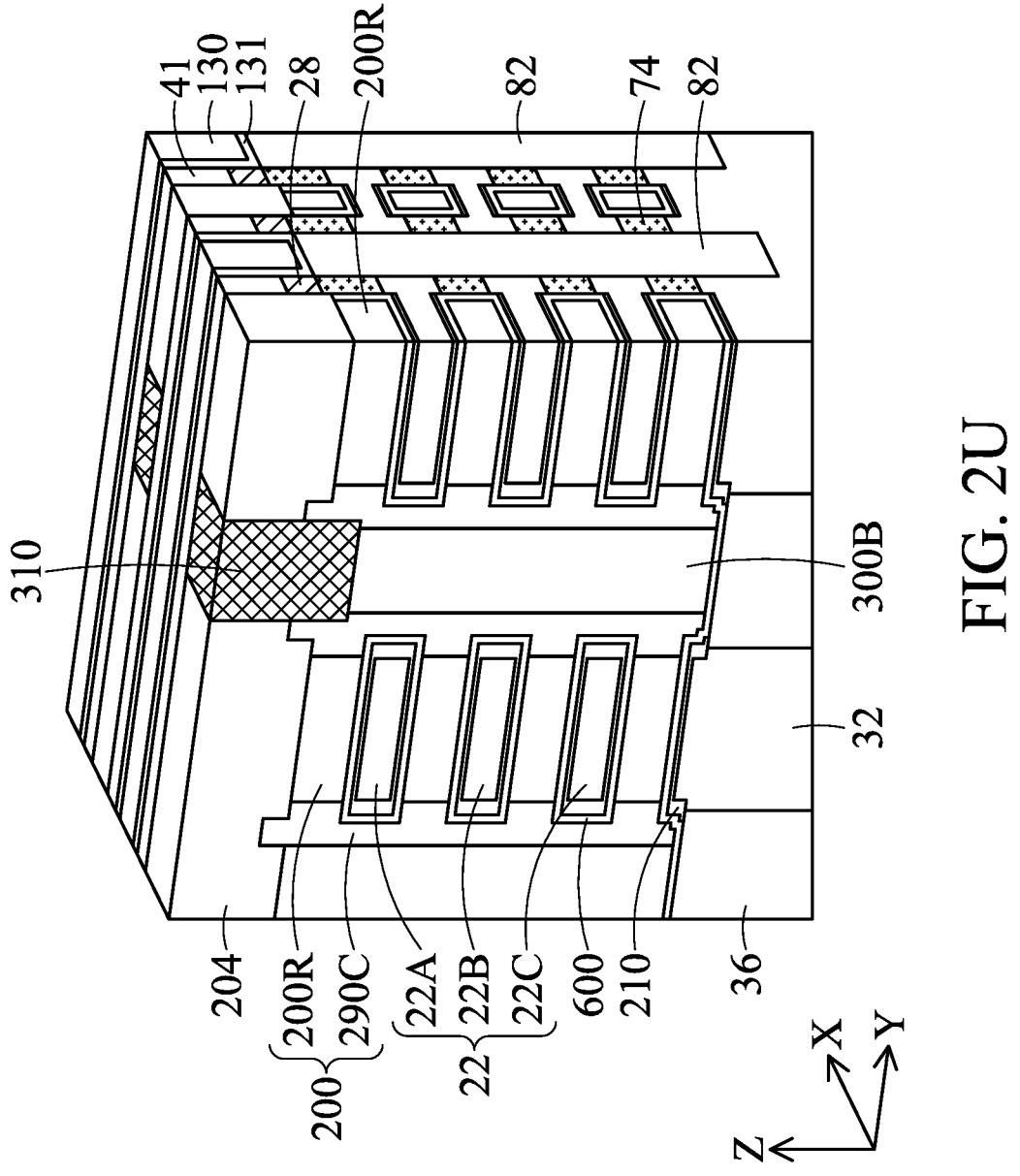
Figure 2V:
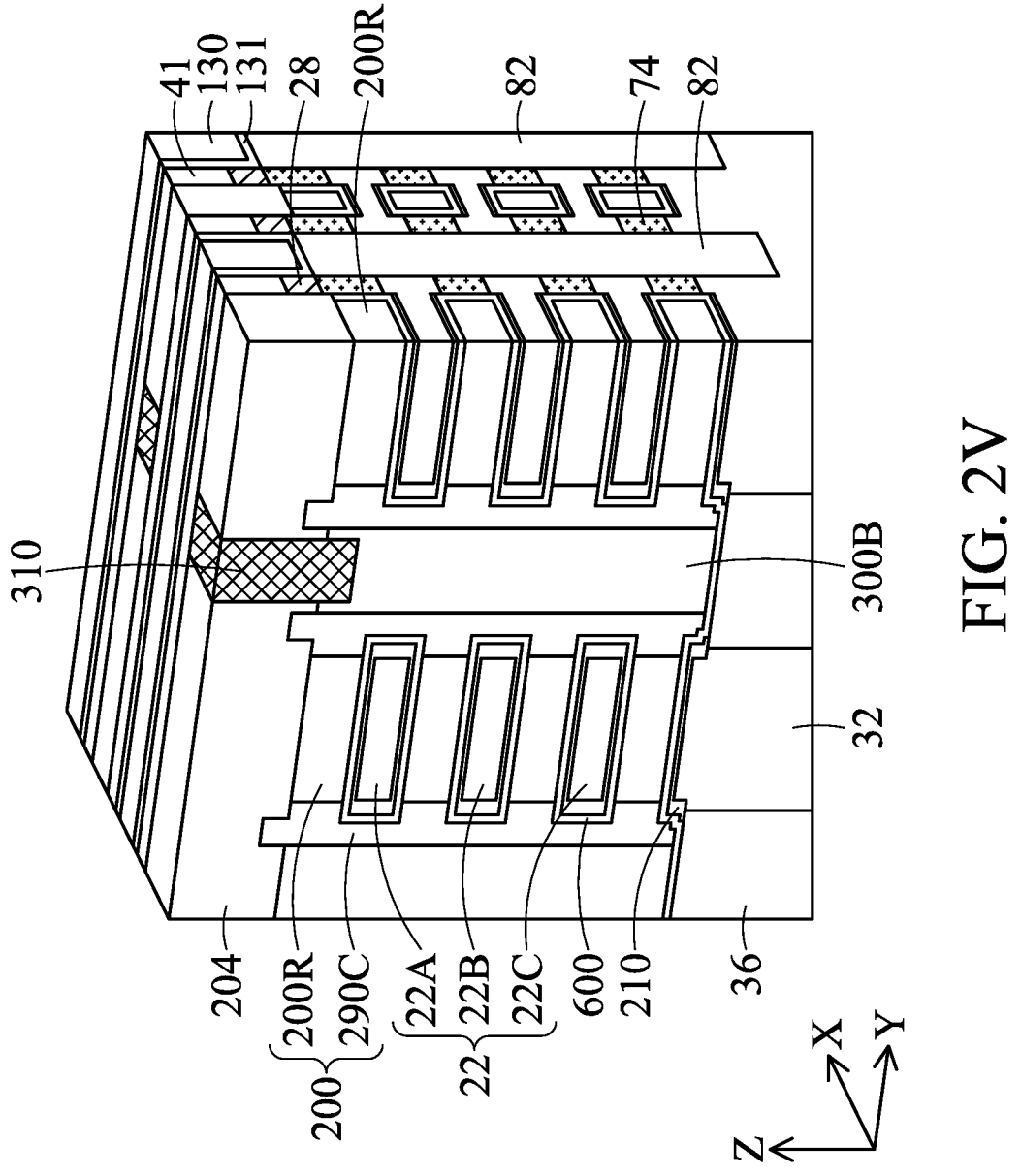
Figure 2W:
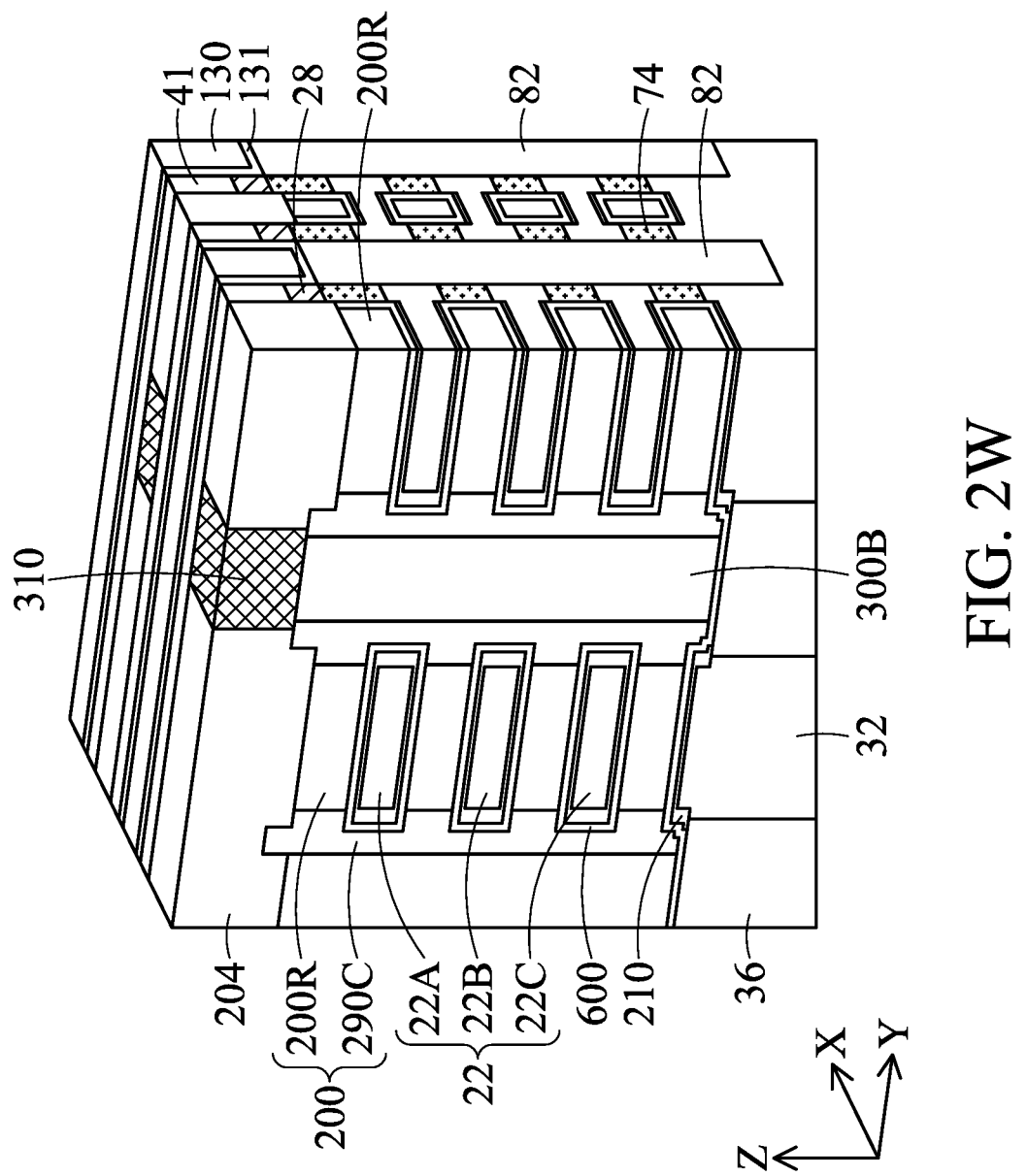
Figure 2X:
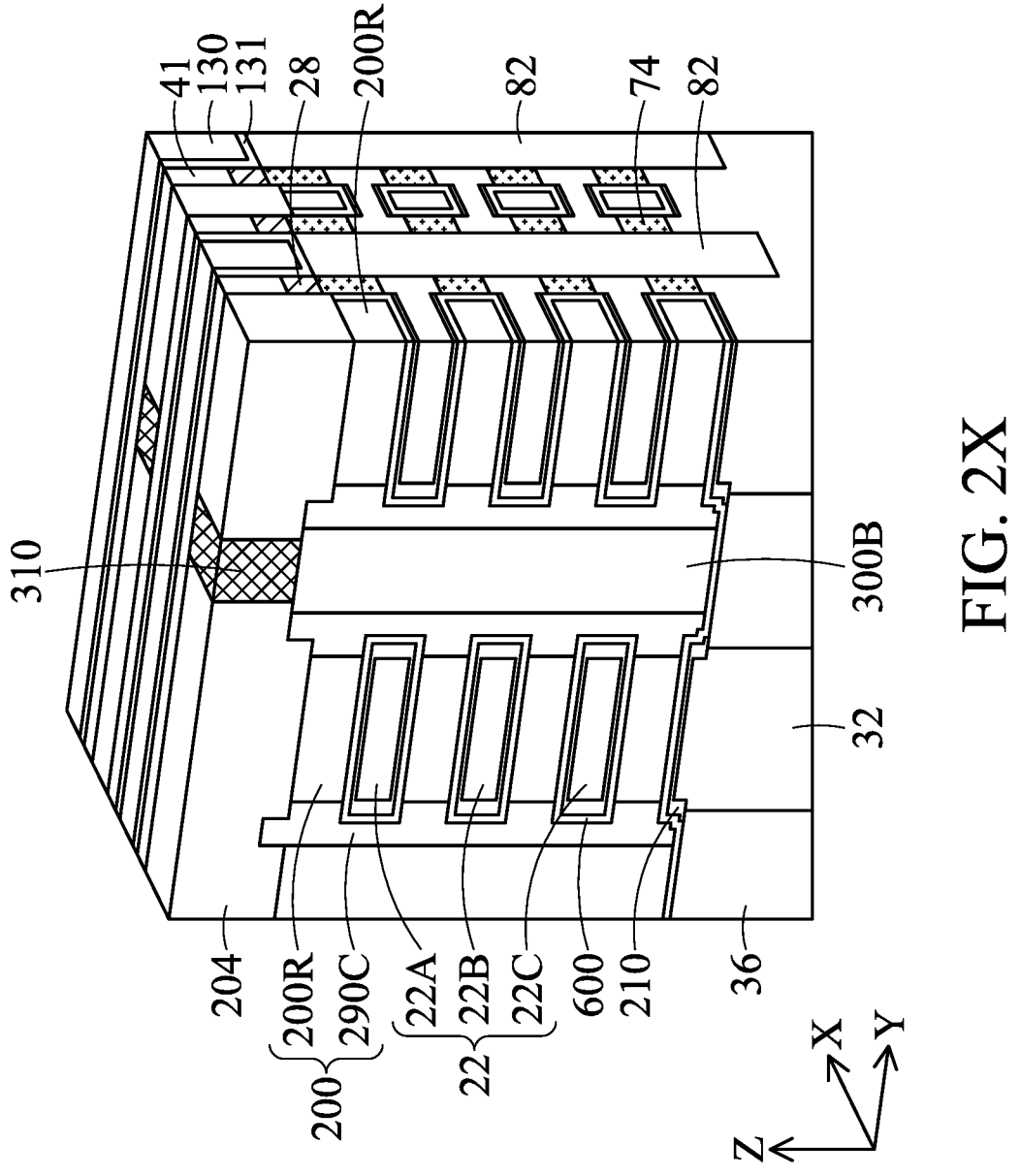

FIGS. 2A-2X illustrate diagrammatic views of intermediate stages in the manufacturing of a nanostructure device, in accordance with some embodiments.

Figure 3:
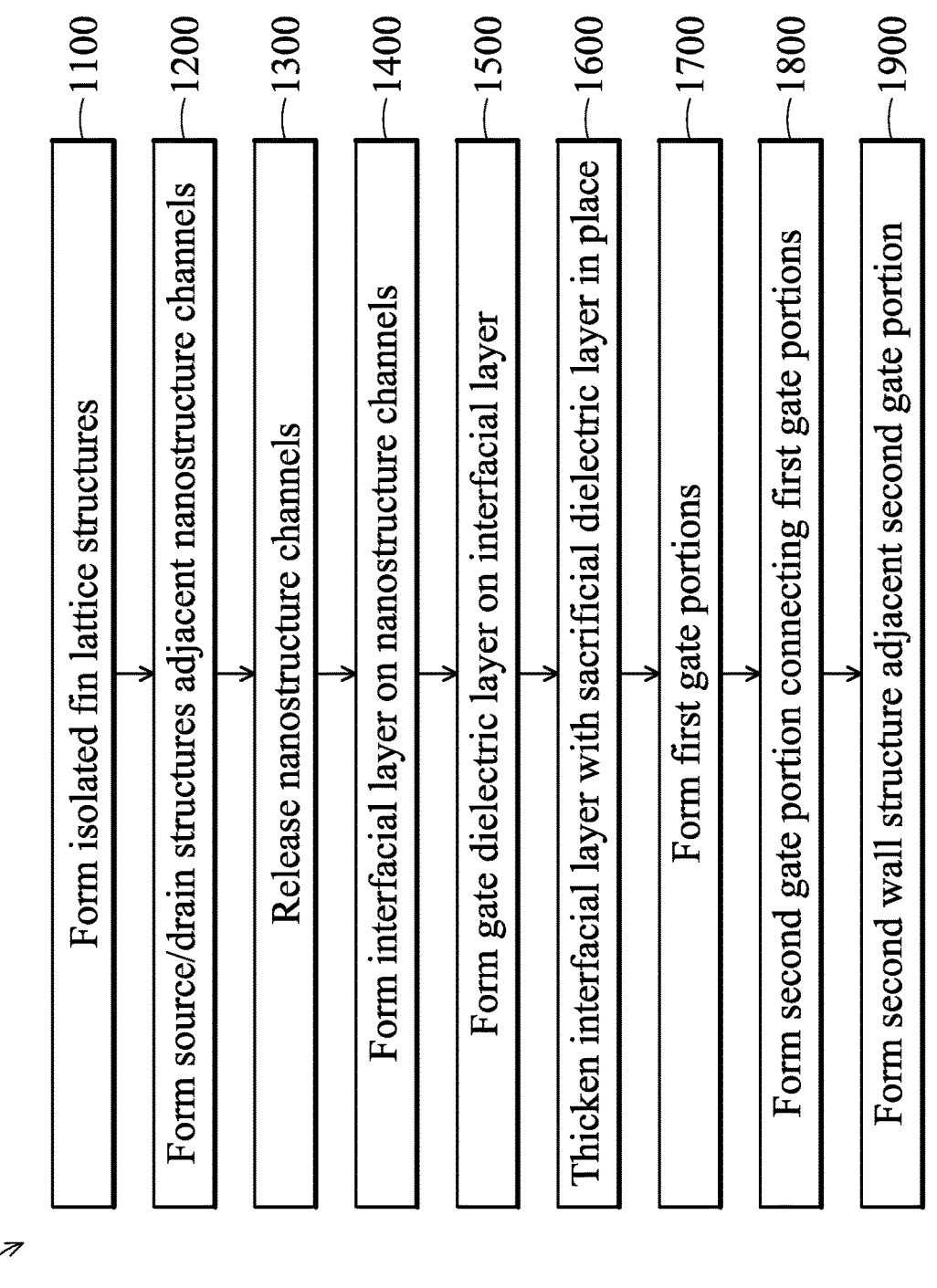
FIG. 3 is a flowchart illustrating a method of fabricating a semiconductor device according to various aspects of the present disclosure.

FIG. 3 illustrates a flowchart of a method 1000 for forming an IC device or a portion thereof from a workpiece, according to one or more aspects of the present disclosure. The method 1000 is merely an example and is not intended to limit the present disclosure to what is explicitly illustrated in the method 1000. Additional acts can be provided before, during and after the method 1000 and some acts described can be replaced, eliminated, or moved around for additional embodiments of the methods. Not all acts are described herein in detail for reasons of simplicity. The method 1000 is described below in conjunction with fragmentary perspective and/or cross-sectional views of a workpiece, shown in FIGS. 2A-2X, at different stages of fabrication according to embodiments of the method 1000. For avoidance of doubt, throughout the figures, the X direction is perpendicular to the Y direction and the Z direction is perpendicular to both the X direction and the Y direction. It is noted that, because the workpiece may be fabricated into a semiconductor device, the workpiece may be referred to as the semiconductor device as the context requires.

In FIG. 2A, a substrate 110 is provided. The substrate 110 may be a semiconductor substrate, such as a bulk semiconductor, or the like, which may be doped (e.g., with a p-type or an n-type dopant) or undoped. The semiconductor material of the substrate 110 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof. Other substrates, such as single-layer, multi-layered, or gradient substrates may be used.

Further in FIG. 2A, a multi-layer stack 25 or "lattice" is formed over the substrate 110 of alternating layers of first semiconductor layers 21A, 21B, 21C (collectively referred to as first semiconductor layers 21) and second semiconductor layers 23. In some embodiments, the first semiconductor layers 21 are formed of a first semiconductor material suitable for n-type nano-FETs, such as silicon, silicon carbide, or the like, and the second semiconductor layers 23 are formed of a second semiconductor material suitable for p-type nano-FETs, such as silicon germanium or the like. Each of the layers of the multi-layer stack 25 may be epitaxially grown using a process such as chemical vapor deposition (CVD), atomic layer deposition (ALD), vapor phase epitaxy (VPE), molecular beam epitaxy (MBE), or the like.

Three layers of each of the first semiconductor layers 21 and the second semiconductor layers 23 are illustrated. In some embodiments, the multi-layer stack 25 may include one or two each or four, five or more each of the first semiconductor layers 21 and the second semiconductor layers 23. Although the multi-layer stack 25 is illustrated as including a second semiconductor layer 23 as the bottommost layer, in some embodiments, the bottommost layer of the multi-layer stack 25 may be a first semiconductor layer 21.

Due to high etch selectivity between the first semiconductor materials and the second semiconductor materials, the second semiconductor layers 23 of the second semiconductor material may be removed without significantly removing the first semiconductor layers 21 of the first semiconductor material, thereby allowing the first semiconductor layers 21 to be patterned to form channel regions of nano-FETs. In some embodiments, the first semiconductor layers 21 are removed and the second semiconductor layers 23 are patterned to form channel regions. The high etch selectivity allows the first semiconductor layers 21 of the first semiconductor material to be removed without significantly removing the second semiconductor layers 23 of the second semiconductor material, thereby allowing the second semiconductor layers 23 to be patterned to form channel regions of nano-FETs.

In some embodiments, an upper semiconductor layer 27 is on the first semiconductor layer 21A. The upper semiconductor layer 27 may be the same material as the second semiconductor layers 23, such as silicon germanium.

In some embodiments, a hard mask layer 28 may be formed over the upper semiconductor layer 27. The hard mask layer 28 may be or include one or more of SIN, SiCN, SiO2, SION, SiOCN, or the like.

In FIG. 2B, fins 32 are formed in the substrate 110 and vertical stacks of nanostructures 22, 24 are formed in the multi-layer stack 25 corresponding to act 1100 of FIG. 3. In some embodiments, the nanostructures 22, 24 and the fins 32 may be formed by etching trenches in the multi-layer stack 25 and the substrate 110. The etching may be any acceptable etch process, such as a reactive ion etch (RIE), neutral beam etch (NBE), the like, or a combination thereof. The etching may be anisotropic. First nanostructures 22A-22C (also referred to as "channels" below) are formed from the first semiconductor layers 21, and second nanostructures 24 are formed from the second semiconductor layers 23. Distance between adjacent fins 32 and nanostructures 22, 24 may be from about 18 nm to about 100 nm. A portion of the device 10 is illustrated in FIG. 2B including two fins 32 for simplicity of illustration. The method 1000 illustrated in FIGS. 2A-2X may be extended to any number of fins 32, and is not limited to the two fins 32 shown in FIGS. 2A-2X.

The channels 22A-22C may include a semiconductive material, for example silicon or a silicon compound, such as silicon germanium, or the like. In some embodiments, the fin 32 includes silicon. The channels 22A-22C are nanostructures (e.g., having sizes that are in a range of a few nanometers) and may also each have an elongated shape and extend in the X-direction. In some embodiments, the channels 22A-22C each have a nano-wire (NW) shape, a nano-sheet (NS) shape, a nano-tube (NT) shape, or other suitable nanoscale shape. The cross-sectional profile of the channels 22A-22C may be rectangular, round, square, circular, elliptical, hexagonal, or combinations thereof.

FIG. 2B illustrates the fins 32 having straight sidewalls. In some embodiments, the fins 32 have tapered sidewalls, such that a width of each of the fins 32, the nanostructures 22, 24, or both continuously increases in a direction towards the substrate 110. In such embodiments, each of the nanostructures 22, 24 may have a different width and have trapezoidal profile (e.g., in the Y-Z plane). In other embodiments, the sidewalls are substantially vertical (non-tapered) as shown, such that width of the fins 32 and the nanostructures 22, 24 is substantially similar, and each of the nanostructures 22, 24 is rectangular in profile (e.g., in the Y-Z plane).

In FIG. 2C, isolation regions 36, which may be shallow trench isolation (STI) regions, are formed adjacent the fins 32. The isolation regions 36 may be formed by depositing an insulation material over the substrate 110, the fins 32, and nanostructures 22, 24, and between adjacent fins 32 and nanostructures 22, 24. The insulation material may be an oxide, such as silicon oxide, a nitride, the like, or a combination thereof, and may be formed by high-density plasma CVD (HDP-CVD), flowable CVD (FCVD), the like, or a combination thereof. In some embodiments, a liner (not separately illustrated) may first be formed along surfaces of the substrate 110, the fins 32, and the nanostructures 22, 24. Thereafter, a fill material, such as those discussed above may be formed over the liner.

The insulation material undergoes a removal process, such as a chemical mechanical polish (CMP), an etch-back process, combinations thereof, or the like, to remove excess insulation material over the nanostructures 22, 24 (e.g., over the hard mask layer 28). Top surfaces of the nanostructures 22, 24 may be exposed and level with the insulation material after the removal process is complete. In some embodiments, the hard mask layer 28 is present over the nanostructures 22, 24 to protect the nanostructures 22, 24 during the removal process that removes the excess insulation material over the nanostructures 22, 24. The hard mask layer 28 may be exposed and level with the insulation material after the removal process is complete.

The insulation material is then recessed to form the isolation regions 36. After recessing, the nanostructures 22, 24 and upper portions of the fins 32 may protrude from between neighboring isolation regions 36. The isolation regions 36 may have top surfaces that are flat as illustrated, convex, concave, or a combination thereof. In some embodiments, the isolation regions 36 are recessed by an acceptable etching process, such as an oxide removal using, for example, dilute hydrofluoric acid (dHF), which is selective to the insulation material and leaves the fins 32, the nanostructures 22, 24 and the hard mask layer 28 substantially unaltered.

FIGS. 2A through 2C illustrate one embodiment (e.g., etch last) of forming the fins 32 and the nanostructures 22, 24. In some embodiments, the fins 32 and/or the nanostructures 22, 24 are epitaxially grown in trenches in a dielectric layer (e.g., etch first). The epitaxial structures may comprise the alternating semiconductor materials discussed above, such as the first semiconductor materials and the second semiconductor materials.

Further in FIG. 2C, appropriate wells (not separately illustrated) may be formed in the fins 32, the nanostructures 22, 24, and/or the isolation regions 36. Using masks, an n-type impurity implant may be performed in p-type regions of the substrate 110, and a p-type impurity implant may be performed in n-type regions of the substrate 110. Example n-type impurities may include phosphorus, arsenic, antimony, or the like. Example p-type impurities may include boron, boron fluoride, indium, or the like. An anneal may be performed after the implants to repair implant damage and to activate the p-type and/or n-type impurities. In some embodiments, in situ doping during epitaxial growth of the fins 32 and the nanostructures 22, 24 may obviate separate implantations, although in situ and implantation doping may be used together.

The fins 32 and the nanostructures 22, 24 may be patterned by any suitable method. For example, one or more photolithography processes, including double-patterning or multi-patterning processes, may be used to form the fins 32 and the nanostructures 22, 24. Generally, double-patterning or multi-patterning processes combine photolithography and self-aligned processes, allowing for pitches smaller than what is otherwise obtainable using a single, direct photolithography process. As an example of one multi-patterning process, a sacrificial layer may be formed over a substrate and patterned using a photolithography process. Spacers are formed alongside the patterned sacrificial layer using a self-aligned process. The sacrificial layer is then removed, and the remaining spacers may then be used to pattern the fins 32.

In FIG. 2D, dummy (or "sacrificial") gate structures 40 are formed over the fins 32, the nanostructures 22, 24, or both. A dummy or sacrificial gate layer 45 is formed over the fins 32 and/or the nanostructures 22, 24. The dummy gate layer 45 may be made of materials that have a high etching selectivity versus the isolation regions 36. The dummy gate layer 45 may be a conductive, semiconductive, or non-conductive material and may be or include amorphous silicon, polycrystalline-silicon (polysilicon), poly-crystalline silicon-germanium (poly-SiGe), metallic nitrides, metallic silicides, metallic oxides, and metals. The dummy gate layer 45 may be deposited by physical vapor deposition (PVD), CVD, sputter deposition, or other techniques for depositing the selected material. One or more mask layers 47A, 47B are formed over the dummy gate layer 45, and may include, for example, silicon nitride, silicon oxynitride, or the like. In some embodiments, a gate dielectric layer 44 is formed before the dummy gate layer 45 between the dummy gate layer 45 and the fins 32, the nanostructures 22, 24 or both. Portions of material layers of the dummy gate layer 45 and the gate dielectric layer 44 exposed by the hard mask layers 47A, 47B may be removed by a suitable etching process to form the dummy gate layer 45 and the gate dielectric layer 44.

In FIG. 2E, following formation of the dummy gate structures 40, first wall structures 300A are formed on the isolation structures 36 in openings between neighboring pairs of the vertical stacks of nanostructures 22 and neighboring pairs of the dummy gate structures 40, as shown. Forming the first wall structures 300A may include depositing a dielectric material by a suitable deposition process, such as a PVD, CVD, ALD, or the like. The dielectric material may be or include SiN, SiCN, SiOCN, SiOC, and is different than the dielectric material of the isolation structures 36. Following deposition, the dielectric material of the first wall structures 300A may be recessed by a suitable etching operation. Following the etching operation, the first wall structures 300A may have upper surfaces that are lower than an upper surface of the hard mask layer 28 by a distance (e.g., in the Z-axis direction) that is in a range of about 15 nm to about 20 nm. In some embodiments, the first wall structures 300A have width (e.g., in the Y-axis direction) in a range from about 20 nm to about 100 nm.

In FIG. 2F, following formation of the first wall structures 300A, a spacer layer 41 is formed over sidewalls of the mask layers 47A, 47B, the dummy gate layer 45 and the gate dielectric layer 44. The spacer layer 41 is made of an insulating material, such as silicon nitride, silicon oxide, silicon carbo-nitride, silicon oxynitride, silicon oxy carbo-nitride, or the like, and may have a single-layer structure or a multi-layer structure including a plurality of dielectric layers, in accordance with some embodiments. The spacer layer 41 may be formed by depositing a spacer material layer (not shown) over the mask layers 47A, 47B and the dummy gate layer 45. Portions of the spacer material layer between dummy gate structures 40 are removed using an anisotropic etching process, in accordance with some embodiments.

Following formation of the first wall structures 300A, an etching process is performed to recess the portions of protruding fins 32 and/or nanostructures 22, 24 that are not covered by dummy gate structures 40, resulting in the structure shown. The recessing may be anisotropic, such that the portions of fins 32 directly underlying dummy gate structures 40 and the spacer layer 41 are protected, and are not etched. The top surfaces of the recessed fins 32 may be below the top surfaces of the isolation regions 36 as shown, in accordance with some embodiments. The top surfaces of the recessed fins 32 may be substantially coplanar with, or higher than, the top surfaces of the isolation regions 36, in accordance with some other embodiments. The etching process may be used to form any number of vertical stacks of nanostructures 22, 24 over the fins 32.

In some embodiments, the lengths (e.g., measured in the X-direction) of the channels 22A-22C may be different from each other, for example due to tapering during a fin etching process illustrated in FIG. 2F. In some embodiments, length of the channel 22A may be less than a length of the channel 22B, which may be less than length of the channel 22C. The channels 22A-22C each may not have uniform thickness, for example due to a channel trimming process used to expand spacing (e.g., measured in the Z-direction) between the channels 22A-22C to increase gate structure fabrication process window. For example, a middle portion of each of the channels 22A-22C may be thinner than the two ends of each of the channels 22A-22C. Such shape may be collectively referred to as a "dog-bone" shape, and is shown in FIG. 2I.

In some embodiments, the spacing between the channels 22A-22C (e.g., between the channel 22B and the channel 22A or the channel 22C) is in a range between about 8 nanometers (nm) and about 12 nm. In some embodiments, a thickness (e.g., measured in the Z-direction) of each of the channels 22A-22C is in a range between about 5 nm and about 8 nm. In some embodiments, a width (e.g., measured in the Y-direction) of each of the channels 22A-22C is at least about 8 nm.

In some embodiments, exposed portions of the first wall structures 300A are recessed by the etching process. As shown in FIG. 2F, the first wall structure 300A may be recessed such that an upper surface thereof is about level with an upper surface of the channel 22B. Remaining height of the first wall structures 300A may be selected to be beneficial to performance of the device 10.

FIG. 2F illustrates one process for forming the spacer layer 41. In some embodiments, one or more layers of the spacer layer 41 is formed alternately or additionally after removal of the dummy gate layer 45. In such embodiments, the dummy gate layer 45 is removed, leaving an opening, and the spacer layer 41 may be formed by conformally coating material of the spacer layer 41 along sidewalls of the opening. The conformally coated material may then be removed from the bottom of the opening corresponding to the top surface of the uppermost channel, e.g., the channel 22A, prior to forming an active gate, such as the gate structure 200.

FIG. 2G illustrates formation of inner spacers 74. A selective etching process is performed to recess end portions of the nanostructures 24 exposed by openings in the spacer layer 41 without substantially attacking the nanostructures 22. After the selective etching process, recesses are formed in the nanostructures 24 at locations where the removed end portions used to be.

Next, an inner spacer layer is formed to fill the recesses in the nanostructures 24 formed by the previous selective etching process. The inner spacer layer may be a suitable dielectric material, such as silicon carbon nitride (SiCN), silicon oxycarbonitride (SiOCN), or the like, formed by a suitable deposition method such as PVD, CVD, ALD, or the like. An etching process, such as an anisotropic etching process, is performed to remove portions of the inner spacer layers disposed outside the recesses in the nanostructures 24. The remaining portions of the inner spacer layers (e.g., portions disposed inside the recesses in the nanostructures 24) form the inner spacers 74. The resulting structure is shown in FIG. 2G.

The nanostructure devices 10 may include gate spacers 41 and inner spacers 74. The inner spacers 74 are disposed between the channels 22A-22C. The gate spacers 41 and the inner spacers 74 may include a dielectric material, for example a low-k material such as SiOCN, SION, SIN, SiCN or SiOC. In some embodiments, one or more additional spacer layers are present abutting the gate spacers 41. In some embodiments, thickness of the inner spacers 74 (e.g., in the X-axis direction) is in a range of about 3 nm to about 10 nm. In some embodiments, thickness of the gate spacers 41 (e.g., in the X-axis direction) is in a range of about 3 nm to about 10 nm. In some embodiments, bottom spacers (not illustrated) are formed on the exposed portions of the fins 32 prior to forming the source/drain regions 82 (see FIG. 2H). In some embodiments, the bottom spacers include a material such as SiOCN, SiON, SiN, SiCN or SiOC, and have thickness (e.g., in the Z-axis direction) of about 3 nm to about 10 nm. The bottom spacers are optional, and are not present in some embodiments, for example, as shown in FIG. 2G.

FIG. 2H illustrates formation of source/drain regions 82 corresponding to act 1200 of FIG. 3. Source/drain region(s) may refer to a source or a drain, individually or collectively dependent upon the context. In the illustrated embodiment, the source/drain regions 82 are epitaxially grown from epitaxial material(s). In some embodiments, the source/drain regions 82 exert stress in the respective channels 22A-22C, thereby improving performance. The source/drain regions 82 are formed such that each dummy gate structure 40 is disposed between respective neighboring pairs of the source/drain regions 82. In some embodiments, the spacer layer 41 separates the source/drain regions 82 from the dummy gate layer 45 by an appropriate lateral distance to prevent electrical bridging to subsequently formed gates of the resulting device.

The source/drain regions 82 may include any acceptable material, such as appropriate for n-type or p-type devices. For n-type devices, the source/drain regions 82 include materials exerting a tensile strain in the channel regions, such as silicon, SiC, SiCP, SiP, or the like, in some embodiments. When p-type devices are formed, the source/drain regions 82 include materials exerting a compressive strain in the channel regions, such as SiGe, SiGeB, Ge, GeSn, or the like, in accordance with certain embodiments. In some embodiments, the source/drain regions 82 have width (e.g., in the Y-axis direction) in a range of about 0.5 nm to about 100 nm. In some embodiments, height of the source/drain regions 82 (e.g., in the Z-axis direction) is in a range of about 0.1 nm to about 100 nm. The height of the source/drain regions 82 may be measured from an interface between a respective source/drain region 82 and the fin 32 on which it is disposed to a top of the source/drain region 82. The source/drain regions 82 may have surfaces raised from respective surfaces of the fins and may have facets. Neighboring source/drain regions 82 may merge in some embodiments to form a singular source/drain region 82 adjacent two neighboring fins 32.

The source/drain regions 82 may be implanted with dopants followed by an anneal. The source/drain regions may have an impurity concentration of between about $10^{19}$ $cm^{-3}$ and about $10^{21}$ $cm^{-3}$. N-type and/or p-type impurities for source/drain regions 82 may be any of the impurities previously discussed. In some embodiments, the source/drain regions 82 are in situ doped during growth.

In FIG. 2I, following formation of the source/drain regions 82, a contact etch stop layer (CESL) 131 and interlayer dielectric (ILD) 130 are formed covering the the source/drain regions 82. In some embodiments, following formation of the ILD 130, the ILD 130 may be recessed, and a capping layer 395 may be formed over the ILD 130. The capping layer 395, also referred to as a "self-aligned capping" (SAC) layer, may provide protection to the underlying ILD 130 and source/drain regions 82 during formation of the gate structures 200. The capping layer 395 may be a dielectric layer including a dielectric material, such as SiC, LaO, AlO, AlON, ZrO, HfO, SiN, Si, ZnO, ZrN, ZrAlO, TiO, TaO, YO, TaCN, ZrSi, SiOCN, SiOC, SiCN, HfSi, LaO, or other suitable dielectric material. Thickness of the capping layer 395 may be in a range of about 7 nm to about 50 nm.

Following formation of the ILD 130 and optional capping layer 395, the channels 22A-22C are released by removal of the mask layers 47A, 47B, the dummy gate layer 45, and the nanostructures 24, corresponding to act 1300 of FIG. 3. A planarization process, such as a CMP, may be performed to remove the mask layers 47A, 47B, and to level the top surfaces of the dummy gate layer 45 and gate spacer layer 41. The planarization process removes the mask layers 47A, 47B on the dummy gate layer 45, and portions of the gate spacer layer 41 along sidewalls of the mask layers 47A, 47B. Accordingly, the top surfaces of the dummy gate layers 45 are exposed.

Next, the dummy gate layer 45 is removed in an etching process, so that recesses are formed. In some embodiments, the dummy gate layer 45 is removed by an anisotropic dry etch process. For example, the etching process may include a dry etch process using reaction gas(es) that selectively etch the dummy gate layer 45 without etching the spacer layer 41. The dummy gate dielectric 44, when present, may be used as an etch stop layer when the dummy gate layer 45 is etched. The dummy gate dielectric may then be removed after the removal of the dummy gate layer 45.

The nanostructures 24 are removed to release the nanostructures 22. After the nanostructures 24 are removed, the nanostructures 22 form a plurality of nanosheets that extend horizontally (e.g., parallel to a major upper surface of the substrate 110). The nanosheets may be collectively referred to as the channels 22 of the nanostructure devices 10 formed.

In some embodiments, the nanostructures 24 are removed by a selective etching process using an etchant that is selective to the material of the nanostructures 24, such that the nanostructures 24 are removed without substantially attacking the nanostructures 22. In some embodiments, the etching process is an isotropic etching process using an etching gas, and optionally, a carrier gas, where the etching gas comprises $F_2$ and HF, and the carrier gas may be an inert gas such as Ar, He, $N_2$, combinations thereof, or the like.

In some embodiments, the nanostructures 24 are removed and the nanostructures 22 are patterned to form channel regions of both PFETs and NFETs. However, in some embodiments the nanostructures 24 may be removed and the nanostructures 22 may be patterned to form channel regions of NFETs, and nanostructures 22 may be removed and the nanostructures 24 may be patterned to form channel regions of PFETs. In some embodiments, the nanostructures 22 may be removed and the nanostructures 24 may be patterned to form channel regions of NFETs, and the nanostructures 24 may be removed and the nanostructures 22 may be patterned to form channel regions of PFETs. In some embodiments, the nanostructures 22 may be removed and the nanostructures 24 may be patterned to form channel regions of both PFETs and NFETs.

In some embodiments, the nanosheets 22 are reshaped (e.g. thinned) by a further etching process to improve gate fill window. The reshaping may be performed by an isotropic etching process selective to the nanosheets 22. After reshaping, the nanosheets 22 may exhibit the dog bone shape in which middle portions of the nanosheets 22 are thinner than peripheral portions of the nanosheets 22 along the X direction, which is shown in FIG. 2I.

In FIG. 2I, releasing of the nanosheets 22 includes removing exposed portions of the first wall structure 300A, such that upper surfaces of the isolation regions 36 are exposed.

In FIGS. 2J-2O, replacement gates 200 are formed, corresponding to act 1300 of FIG. 3. The gate structure 200 generally includes the interfacial layer (IL, or "first IL") 210, at least one gate dielectric layer 600, the work function metal layer 900, and the gate fill layer 290. In some embodiments, each replacement gate 200 further includes at least one of a second interfacial layer 240 or a second work function layer 700. Detailed structure of the gate structure 200 described with reference to FIG. 2M.

In FIG. 2J, the interfacial layer 210, which may be an oxide of the material of the channels 22A-22C, is formed on exposed areas of the channels 22A-22C and the top surface of fins 32 when present, corresponding to act 1400 of FIG. 3. The interfacial layer 210 may be formed by an oxide growth operation. The interfacial layer 210 promotes adhesion of the gate dielectric layers 600 to the channels 22A-22C. In some embodiments, the interfacial layer 210 has thickness of about 5 Angstroms (A) to about 50 Angstroms (A). In some embodiments, the interfacial layer 210 has thickness of about 10 A. The interfacial layer 210 having thickness that is too thin may exhibit voids or insufficient adhesion properties. The interfacial layer 210 being too thick consumes gate fill window, which is related to threshold voltage tuning and resistance as described above. In some embodiments, the interfacial layer 210 is doped with a dipole, such as lanthanum, for threshold voltage tuning.

The gate dielectric layer 600 is formed on the interfacial layer 210 by a suitable deposition process, such as a PVD, CVD, ALD, or the like, corresponding to act 1500 of FIG. 3. In some embodiments, the gate dielectric layer 600 includes at least one high-k gate dielectric material, which may refer to dielectric materials having a high dielectric constant that is greater than a dielectric constant of silicon oxide (k≈3.9). Exemplary high-k dielectric materials include $HfO_2$, HfSiO, HfSiON, HfTaO, HfTiO, HfZrO, $ZrO_2$, $Ta_2O_5$, or combinations thereof. In some embodiments, the gate dielectric layer 600 has thickness of about 5 A to about 100 A. In some embodiments, the gate dielectric layer 600 may include a non-high-k dielectric material such as silicon oxide. In some embodiments, the gate dielectric layer 600 includes more than one high-k dielectric layer, of which at least one includes dopants, such as lanthanum, magnesium, yttrium, or the like, which may be driven in by an annealing process to modify threshold voltage of the nanostructure devices 10.

In some embodiments, the gate dielectric layer 600 may include dopants, such as metal ions driven into the high-k gate dielectric from $La_2O_3$, MgO, $Y_2O_3$, $TiO_2$, $Al_2O_3$, $Nb_2O_5$, or the like, or boron ions driven in from $B_2O_3$, at a concentration to achieve threshold voltage tuning. As one example, for N-type transistor devices, lanthanum ions in higher concentration reduce the threshold voltage relative to layers with lower concentration or devoid of lanthanum ions, while the reverse is true for P-type devices. In some embodiments, the gate dielectric layer 600 of certain transistor devices (e.g., IO transistors) is devoid of the dopant that is present in certain other transistor devices (e.g., N-type core logic transistors or P-type IO transistors). In N-type IO transistors, for example, relatively high threshold voltage is desirable, such that it may be preferable for the IO transistor high-k dielectric layers to be free of lanthanum ions, which would otherwise reduce the threshold voltage.

As shown in FIG. 2J, the gate dielectric layer 600 may be formed on exposed surfaces of the hard mask layer 28.

In FIG. 2K, following formation of the interfacial layer 210 and the gate dielectric layer 600, a sacrificial dielectric layer 280 is formed in spaces between channels 22A-22C and between the channel 22A and the hard mask layer 28. The sacrificial dielectric layer 280 may be formed by a suitable deposition process, such as a CVD, ALD, or the like. The sacrificial dielectric layer 280 may be or include SIN, SiCN, SiOx, SiON, SiOCN, combinations thereof, or the like, and has high etch selectivity relative to the material of the hard mask layer 28, which is beneficial when removing the sacrificial dielectric layer 280 in a subsequent operation described with reference to FIG. 2N. In the deposition process, a material layer including one or more of the above dielectric materials of the sacrificial dielectric layer 280 may be deposited as a conformal layer that covers exposed surfaces of the gate dielectric layer 600, including between the channels 22A-22C and the hard mask layer 28. Following deposition of the material layer, an anisotropic etch may be performed to remove excess portions of the material layer over the hard mask layer 28 and the isolation regions 36, while leaving the material layer positioned between the channels 22A-22C and the hard mask layer 28. An optional isotropic etch may then be performed to horizontally recess the material layer, resulting in the sacrificial dielectric layer 280 structure shown in FIG. 2K. The sacrificial dielectric layer 280 protects middle portions of the interfacial layer 210 and the gate dielectric layer 600, for example, along the Y-axis direction.

In FIG. 2L, following formation of the sacrificial dielectric layer 280, end portions of the interfacial layer 210 are thickened by an annealing process, corresponding to act 1600 of FIG. 3. In some embodiments, the annealing process includes a treatment by oxygen ($O_2$) at a temperature in a range of about 100° C. to about 900° C. Following the annealing process, thickness of the interfacial layer 210 at the horizontal ends of the channels 22A-22C and the top portion of the fins 32 may be in a range of about 2 nm to about 3 nm. In some embodiments, the thickness increase of the interfacial layer 210 follows the decrease in thickness of the channels 22A-22C with about a 2:1 ratio. For example, if the thickness of the interfacial layer 210 increases by 1 nm, the total thickness of the interfacial layer 210 plus the channel 22 (e.g., the channel 22A) increases by only 0.5 nm. The total thickness may be controlled to not lead to expansion in the gate dielectric layer 600 that would cause cracks or other defects in the gate dielectric layer 600. Thickening the interfacial layer 210 at the end portions of the channels 22A-22C allows for an inert sheet end device. Following thickening of the end portions of the interfacial layer 210, the end portions may be thicker than the top and bottom portions of the interfacial layer 210. For example, growth of the interfacial layer 210 may be confined to the end portions due to presence of the sacrificial dielectric layer 280 adjacent the top and bottom portions.

As shown in FIG. 2L, following thickening of the end portions of the interfacial layer 210, first portions of the gate dielectric layer 600 laterally adjacent the horizontal ends of the channels 22A-22C may extend beyond second portions of the gate dielectric layer 600 laterally adjacent horizontal ends of the hard mask layer 28.

FIGS. 2M to 2O illustrate formation of remaining portions of the gate structures 200 in accordance with various embodiments. Prior to forming the remaining portions, the sacrificial dielectric layer 280 may be removed, for example, by an appropriate etching process, such as an isotropic etch that is selective to material of the sacrificial dielectric layer 280 without substantially attacking the gate dielectric layer 600 and the hard mask layer 28.

FIG. 2M is a detailed cross-sectional side view of the gate structure 200 in accordance with various embodiments. The gate structure 200 shown in FIG. 2M includes the interfacial layer 210, the gate dielectric layer 600, a second interfacial layer (IL) 240, a work function barrier layer 700, a work function tuning layer 900 and metal layers 290A, 290C. One or more of the second interfacial layer 240, the work function barrier layer 700 and the work function tuning layer 900 are omitted from view in FIG. 2N and FIG. 2O for simplicity of illustration.

Referring to FIG. 2M, the second IL 240 may be formed on the gate dielectric layer 600, and the second work function layer 700 may be formed on the second IL 240. The second IL 240 promotes metal gate adhesion on the gate dielectric layer 600. In many embodiments, the second IL 240 provides improved thermal stability for the gate structure 200, and serves to limit diffusion of metallic impurities from the work function metal layer 900 and/or the work function barrier layer 700 into the gate dielectric layer 600. In some embodiments, formation of the second IL 240 is accomplished by first depositing a high-k capping layer (not illustrated for simplicity) on the gate dielectric layer 600. The high-k capping layer comprises one or more of HfSiON, HfTaO, HfTiO, HfAlON, HfZrO, TiSiN or other suitable materials, in various embodiments. In a specific embodiment, the high-k capping layer comprises titanium silicon nitride (TiSiN). In some embodiments, the high-k capping layer is deposited by an ALD using about 40 to about 100 cycles at a temperature of about 400 degrees C. to about 450 degrees C. A thermal anneal is then performed to form the second IL 240, which may be or comprise TiSiNO, in some embodiments. Following formation of the second IL 240 by thermal anneal, an atomic layer etch (ALE) with artificial intelligence (AI) control may be performed in cycles to remove the high-k capping layer while substantially not removing the second IL 240. Each cycle may include a first pulse of $WCl_5$, followed by an Ar purge, followed by a second pulse of $O_2$, followed by another Ar purge. The high-k capping layer is removed to increase gate fill window for further multiple threshold voltage tuning by metal gate patterning.

The work function barrier layer 700 is optionally included in the gate structure 200, in accordance with some embodiments. The work function barrier layer 700 is or comprises a metal nitride, such as TiN, WN, MON, TaN, or the like. In a specific embodiment, the work function barrier layer 700 is TiN. The work function barrier layer 700 may have thickness ranging from about 5 A to about 20 A. Inclusion of the work function barrier layer 700 provides additional threshold voltage tuning flexibility. In general, the work function barrier layer 700 increases the threshold voltage for NFET transistor devices, and decreases the threshold voltage (magnitude) for PFET transistor devices.

The work function metal layer 900, which may include one or more of an N-type work function metal layer, an in-situ capping layer, and an oxygen blocking layer, is formed on the work function barrier layer 700, in some embodiments. The N-type work function metal layer is or comprises an N-type metal material, such as TiAlC, TiAl, TaAlC, TaAl, or the like. The N-type work function metal layer may be formed by one or more deposition methods, such as CVD, PVD, ALD, plating, and/or other suitable methods, and has a thickness between about 10 A and 20 A. The in-situ capping layer is formed on the N-type work function metal layer. In some embodiments, the in-situ capping layer is or comprises TIN, TiSiN, TaN, or another suitable material, and has a thickness between about 10 A and 20 A. The oxygen blocking layer is formed on the in-situ capping layer to prevent oxygen diffusion into the N-type work function metal layer, which would cause an undesirable shift in the threshold voltage. The oxygen blocking layer is formed of a dielectric material that can stop oxygen from penetrating to the N-type work function metal layer, and may protect the N-type work function metal layer from further oxidation. The oxygen blocking layer may include an oxide of silicon, germanium, SiGe, or another suitable material. In some embodiments, the oxygen blocking layer is formed using ALD and has a thickness between about 10 A and about 20 A.

The first metal layer 290A is formed on the work function metal layer 900, when present. In some embodiments, a glue layer (not separately illustrated) is formed between the oxygen blocking layer of the work function metal layer 900 and the first metal layer 290A. The glue layer may promote and/or enhance adhesion between the first metal layer 290A and the work function metal layer 900. In some embodiments, the glue layer may be formed of a metal nitride, such as TiN, TaN, MON, WN, or another suitable material, using ALD. In some embodiments, thickness of the glue layer is between about 10 A and about 25 A. The first metal layer 290A may be formed on the glue layer, and may include a conductive material such as tungsten, cobalt, ruthenium, iridium, molybdenum, copper, aluminum, or combinations thereof. In some embodiments, the first metal layer 290A may be deposited using methods such as CVD, PVD, plating, and/or other suitable processes. Between the channels 22A-22C, the first metal layer 290A is circumferentially surrounded (in the X-Z cross-sectional view) by the one or more work function metal layers 900, which are then circumferentially surrounded by the gate dielectric layers 600.

In some embodiments, a seam 510, which may be an air gap, is present in the first metal layer 290A vertically between the channels 22A, 22B. In some embodiments, the first metal layer 290A is conformally deposited on the work function metal layer 900. The seam 510 may form due to sidewall deposited film merging during the conformal deposition. In some embodiments, the seam 510 is not present between the neighboring channels 22A, 22B.

In some embodiments, formation of the remaining portions of the gate structures 200 up to formation of the first metal layer 290A may be performed in a first process for forming gate structures 200 of NFETs, and a second process for forming gate structures 200 of PFETs. The first process may be performed prior to the second process, or the second process may be performed prior to the first process. Selection of materials for the NFET gate structures 200 may be different in one or more layers than for the PFET gate structures 200. For example, the work function metal layer 900 of the NFET gate structures 200 may be different than the work function metal layer 900 of the PFET gate structures 200. In some embodiments, the first metal layer 290A of the NFET gate structures 200 is a different material than the first metal layer 290A of the PFET gate structures 200.

Following formation of the first metal layer 290A, portions of the second interfacial layer (IL) 240, the work function barrier layer 700, the work function tuning layer 900 and the first metal layer 290A extending beyond the end portions of the gate dielectric layer 600 (e.g., portions that overlie the isolation regions 36) are removed by a suitable etching process. In some embodiments, the etching process includes an anisotropic etching operation that uses the hard mask layer 28 and portions of the gate dielectric layer 600 adjacent thereto as a mask, such that portions of the second interfacial layer (IL) 240, the work function barrier layer 700, the work function tuning layer 900 and the first metal layer 290A between the channels 22A-22C and the hard mask layer 28 are substantially in tact following the anisotropic etching operation. Following the anisotropic etching operation, an isotropic etching operation may be performed to form horizontal recesses in the remaining portions of the second interfacial layer (IL) 240, the work function barrier layer 700, the work function tuning layer 900 and the first metal layer 290A between the channels 22A-22C and the hard mask layer 28. The remaining portions of the second interfacial layer (IL) 240, the work function barrier layer 700, the work function tuning layer 900 and the first metal layer 290A between the channels 22A-22C and the hard mask layer 28 may be referred to collectively as first gate portions 200R. The formation of the first gate portions 200R as described corresponds to act 1700 of FIG. 3.

In FIG. 2O, following formation of the first gate portions 200R between the channels 22A-22C and the hard mask layer 28, a second gate portion 290C is formed that connects the first gate portions 200R to each other, corresponding to act 1800 of FIG. 3. In some embodiments, the second gate portion 290C is or includes a selective metal, which may be one or more of W, Ti, Pt or the like. It should be understood that "selective metal" refers to a metal that, when deposited, adheres to the first metal layer 290A without substantially adhering to the gate dielectric layer 600. The selective metal may further adhere to one or more of the second interfacial layer (IL) 240, the work function barrier layer 700 and the work function tuning layer 900. Formation of the second gate portion 290C may include a CVD or ALD using a metal chloride precursor, such as $WCl_5$, $TiCl_3$, $PtCl_6$, or the like. During formation of the second gate portion 290C, the selective metal may initial grow outward from the first metal layer 290A without adhering to the gate dielectric layer 600. As additional material of the second gate portion 290C accumulates, neighboring portions of the selective metal may merge, resulting in the structure shown in FIG. 2O. During deposition of the selective metal, some of the selective metal may settle on bottom portions of the gate dielectric layer 600, such as the portion of the gate dielectric layer 600 overlying the isolation region 36. To prevent bridging between neighboring gate structures 200 due to the selective metal on the bottom portions of the gate dielectric layer 600, a cleaning operation, such as a wet etch, may be performed to remove excess material of the second gate portion 290C. As shown in FIG. 2O, openings 35 may be present between the gate structures 200 that overlie and wrap around neighboring stacks of channels 22.

In FIG. 2P, following formation of the gate structures 200, second wall structures 300B are formed in the openings 35, corresponding to act 1900 of FIG. 3. The second wall structures 300B may include a dielectric wall material, which may be or includes SiN, SiCN, SiOCN, SiOC or the like. Width of the second wall structure 300B (e.g., in the Y-axis direction) may be in a range of about 10 nm to about 100 nm. Formation of the second wall structures 300B may include a suitable deposition operation, such as a PVD, CVD, ALD or the like, that deposits the dielectric wall material in the openings 35. In some embodiments, the second wall structures 300B are in contact with the second gate portion 290C, the portions of the gate dielectric layer 600 over the isolation regions 36, or both. The formation of the second wall structures 300B may be a self-aligned process, in which the dielectric wall material, while being deposited, accumulates in the openings 35 from the bottom of the openings 35 to the top of the openings 35. The dielectric wall material, when deposited, may cover the hard mask layer 28 and top surfaces of the second gate portions 290C. Following deposition of the dielectric wall material, excess portions of the dielectric wall material overlying the hard mask layer 28 and the top surfaces of the second gate portions 290C may be removed by a suitable etching operation, resulting in the structure shown in FIG. 2P.

In FIG. 2Q, the hard mask layer 28 is removed. The hard mask layer 28 may be removed by a suitable etching process. In some embodiments, the etching process includes an isotropic etch that removes exposed portions of the gate dielectric layer 600, such as portions of the gate dielectric layer 600 on the gate spacers 41 and on upper and partial side surfaces of the hard mask layer 28, which exposes the hard mask layer 28. Following removal of the portions of the gate dielectric layer 600, the hard mask layer 28 is removed by a suitable etching process, such as an anisotropic etch that removes the hard mask layer 28 without substantially attacking other elements of the structure of FIG. 2Q, and leaves portions of the hard mask layer 28 remaining under the gate spacers 41. Following removal of the hard mask layer 28, portions of the gate dielectric layer 600 underlying the hard mask layer 28 (e.g., between the hard mask layer and upper portions of the gate structure 200) may be removed by another suitable etch process. As shown in FIG. 2Q, portions of the first gate portion 200R under the gate spacers 41 are taller than portions of the first gate portion 200R exposed by the gate spacers 41. In some embodiments, the second gate portions 290C extend to a level higher than that of the first gate portions 200R.

In FIG. 2Q, the second wall structure 300B may be recessed during etching of the hard mask layer 28. In some embodiments, the top surface of the second wall structure 300B following recessing is at a level the same as that of the top surface of the first gate portion 200R. In some embodiments, the top surface of the second wall structure 300B following recessing is at a level that is lower than or higher than that of the top surface of the first gate portion 200R.

In FIG. 2R, a conductive layer 204 is formed on exposed surfaces of the gate structures 200 and the second wall structure 300B. The conductive layer 204 electrically connects two or more gate structures 200 to each other. In some embodiments, the conductive layer 204 is or includes W, Ru, Co, Mo, Cu, or the like, and may be formed by a suitable deposition process, such as a PVD, CVD, ALD, plating, or the like. Following formation of the conductive layer 204, excess material of the conductive layer 204 may be removed from over the surfaces of the ILD 130, the gate spacers 41 and the ESL 131 by, for example, a CMP.

In FIG. 2S-2X, a gate isolation structure 310 is formed to isolate portions of the conductive layer 204 on either side of the gate isolation structure 310 from each other. In some embodiments, material of the gate isolation structure 310 is SiN, or another suitable dielectric material. The gate isolation structure 310 may have width in a range of about 15 nm to about 50 nm. The gate isolation structure 310 extends from the top surface of the conductive layer 204 to the top surface of the second wall structure 300B. In some embodiments, the gate isolation structure 310 is formed by etching an opening in the conductive layer 204 that exposes the second wall structure 300B, then depositing the material of the gate isolation structure 310 in the opening on the second wall structure 300B. The deposition may be a PVD, CVD, ALD or other suitable deposition.

In some embodiments, width (e.g., in the Y-axis direction) of the gate isolation structure 310 is wider than width of the second wall structure 300B, which is shown in FIGS. 2S, 2U, 2W. In some embodiments, the width of the gate isolation structure 310 is narrower than the width of the second wall structure 300B, which is shown in FIGS. 2T, 2V, 2X.

In some embodiments, the gate isolation structure 310 extends to a depth (e.g., has a bottom surface) that is level with the top surface of the gate structure 200, as shown in FIGS. 2S, 2T. In some embodiments, the gate isolation structure 310 extends to a depth (e.g., has a bottom surface) that is below the top surface of the gate structure 200, as shown in FIGS. 2U, 2V. In some embodiments, the gate isolation structure 310 extends to a depth (e.g., has a bottom surface) that is above the top surface of the gate structure 200, as shown in FIGS. 2W, 2X.

In some embodiments, the gate structure 200 includes the conductive layer 204.

Following formation of the gate isolation structure 310, an interconnect structure (not shown) may be formed over the structure of FIG. 2S or FIG. 2T. For example, source/drain contacts, source/drain vias and gate vias may be formed that connect to the source/drain regions 82, the source/drain contacts, and the gate structures 200 (e.g., to the conductive layer 204), respectively.

Embodiments may provide advantages. By forming the sacrificial dielectric layers 280, the second gate portions 290C, and the second wall structures 300B, spacing between adjacent pairs of nanostructure devices 10 may be reduced. By thickening the interfacial layer 210, end portions of the channels 22 are less active (e.g., non-active), such that thickness of the second gate portions 290C may be reduced, which reduces spacing between adjacent pairs of the nanostructure devices 10. As such, chip area of integrated circuit dies including the nanostructure devices 10 embodied herein may also be reduced, such that a greater number of nanostructure devices 10 may be integrated in the same chip area, or the same number of nanostructure devices 10 may occupy a smaller chip area.

In accordance with at least one embodiment, a device includes a first vertical stack of first nanostructures formed over a substrate, a second vertical stack of second nanostructures adjacent to the first vertical stack, and a first gate structure adjacent the first nanostructures. The first gate structure includes a first gate portion between the first nanostructures, and a second gate portion extending from a first sidewall of the first gate portion to a second sidewall of the first gate portion. The second sidewall is between the first sidewall and the substrate, and the second gate portion is a different material than the first gate portion. A second gate structure is adjacent the second nanostructures, and a second wall structure is between the second gate portion and the second gate structure.

In accordance with at least one embodiment, a device comprises a first nanostructure device, which includes a first semiconductor channel over a substrate, a second semiconductor channel over the first semiconductor channel, a first gate portion between the first and second semiconductor channels, a second gate portion between the first and second semiconductor channels, and on vertical sidewalls of the first and second semiconductor channels, and a first source/drain region abutting the first and second semiconductor channels. The device further comprises a second nanostructure device adjacent the first nanostructure device, which includes a third semiconductor channel, a fourth semiconductor channel over the third semiconductor channel, a third gate portion between the third and fourth semiconductor channels, a fourth gate portion between the third and fourth semiconductor channels, and on vertical sidewalls of the third and fourth semiconductor channels, and a second source/drain region abutting the third and fourth semiconductor channels. A first wall structure is between the first and second source/drain regions, and a second wall structure is between the second gate portion and the fourth gate portion.

In accordance with at least one embodiment, a method includes: forming a first vertical stack of first semiconductor nanostructures on a substrate; forming a second vertical stack of second semiconductor nanostructures, the second vertical stack being adjacent the first vertical stack; forming first gate portions between two of the first semiconductor nanostructures and between one of the first semiconductor nanostructures and a hard mask layer; forming a recess by horizontally recessing the first gate portion; and forming a second gate portion in the recess and on vertical sidewalls of the two of the first semiconductor nanostructures and on a vertical sidewall of the hard mask layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device, comprising:
a first vertical stack of first nanostructures formed over a substrate;

a second vertical stack of second nanostructures adjacent to the first vertical stack;
a first gate structure adjacent the first nanostructures, the first gate structure including:
a first gate portion between the first nanostructures;
a second gate portion extending from a first sidewall of the first gate portion to a second sidewall of the first gate portion, the second sidewall being between the first sidewall and the substrate, the second gate portion being a different material than the first gate portion;
an interfacial layer on the first nanostructures, wherein a thickness of the interfacial layer is thicker on horizontal end portions of the first nanostructures than on upper and lower surfaces of the first nanostructures; and
a gate dielectric layer on the interfacial layer;
a second gate structure adjacent the second nanostructures; and
a second wall structure between the second gate portion and the second gate structure.

2. The device of claim 1, wherein the second gate portion includes one or more of tungsten, titanium or platinum.

3. The device of claim 1, further comprising:
a conductive layer on the first gate portion and the second gate portion; and
a gate isolation structure that extends from an upper surface of the conductive layer to a level that is below an uppermost surface of the first gate structure.

4. The device of claim 1, wherein the thickness of the interfacial layer at the horizontal end portions is in a range of about 2 nanometers (nm) to about 3 nm.

5. The device of claim 1, wherein a thickness of the second gate portion adjacent vertical sidewalls of the first nanostructures is in a range of about 3 nm to about 10 nm.

6. The device of claim 1, wherein a width of the second wall structure is in a range of about 10 nm and about 100 nm.

7. The device of claim 1, further comprising:
a first source/drain region abutting the first vertical stack;
a second source/drain region abutting the second vertical stack; and
a first wall structure between the first source/drain region and the second source/drain region.

8. The device of claim 7, wherein a width of the first wall structure is in a range of about 20 nm to about 100 nm.

9. A device, comprising:
a first nanostructure device, including:
a first semiconductor channel over a substrate;
a second semiconductor channel over the first semiconductor channel;
a first gate portion between the first and second semiconductor channels;
a second gate portion between the first and second semiconductor channels, and on vertical sidewalls of the first and second semiconductor channels; and
a first source/drain region abutting the first and second semiconductor channels;
first horizontal end portions of the first semiconductor channel and the second semiconductor channel; and
first upper surfaces and first lower surfaces of the first semiconductor channel and the second semiconductor channel;
a first interfacial layer on the first semiconductor channel and on the second semiconductor channel, wherein a first thickness of the interfacial layer is thicker on the first horizontal end portions of the first semiconductor channel and the second semiconductor channel than on the first upper surfaces and the first lower surfaces of the first semiconductor channel and the second semiconductor channel;

a first gate dielectric layer on the first interfacial layer;

a second nanostructure device adjacent the first nanostructure device, the second nanostructure device including:

a third semiconductor channel;

a fourth semiconductor channel over the third semiconductor channel;

a third gate portion between the third and fourth semiconductor channels;

a fourth gate portion between the third and fourth semiconductor channels, and on vertical sidewalls of the third and fourth semiconductor channels;

a second source/drain region abutting the third and fourth semiconductor channels;

second horizontal end portions of the third semiconductor channel and the fourth semiconductor channel; and second upper surfaces and second lower surfaces of the third semiconductor channel and the fourth semiconductor channel;

a second interfacial layer on the third semiconductor channel and on the fourth semiconductor channel, wherein a second thickness of the interfacial layer is thicker on the second horizontal end portions of the third semiconductor channel and the fourth semiconductor channel than on the second upper surfaces and the second lower surfaces of the third semiconductor channel and the fourth semiconductor channel;

a second gate dielectric layer on the second interfacial layer;

a first wall structure between the first and second source/drain regions; and a second wall structure between the second gate portion and the fourth gate portion.

10. The device of claim 9, wherein an upper surface of the second wall structure is at a level substantially coplanar with an upper surface of the fourth gate portion.

11. The device of claim 9, wherein an upper surface of the second wall structure is at a level lower than an upper surface of the fourth gate portion.

12. The device of claim 9, further comprising:

a conductive layer on the second gate portion and the fourth gate portion; and a gate isolation structure extending from an upper surface of the conductive layer to an upper surface of the second wall structure.

13. The device of claim 12, wherein a width of the gate isolation structure is larger than width of the second wall structure.

14. The device of claim 9, wherein the first thickness of the first interfacial layer is in a range of about 2 nanometers to about 3 nanometers.

15. The device of claim 14, wherein the second thickness of the second interfacial layer is in a range of about 2 nanometers to about 3 nanometers.

16. A device, comprising:

a first vertical stack of semiconductor channels over a substrate;

a second vertical stack of semiconductor channels adjacent to the first vertical stack;

a first gate structure adjacent the first vertical stack, the first gate structure including:

an interfacial layer on the channels having a first thickness on upper and lower surfaces of the channels and a second thickness on horizontal end portions of the channels that is greater than the first thickness;

a gate dielectric on the interfacial layer;

a first gate portion between vertically adjacent ones of the channels, and a second gate portion of a material different from the first gate portion on vertical sidewalls of the channels and connecting the first gate portion across the horizontal end portions;

a second gate structure adjacent the second vertical stack and including:

a third gate portion between vertically adjacent ones of the channels of the second vertical stack;

a fourth gate portion on vertical sidewalls of the channels of the second vertical stack; and a dielectric wall structure disposed between the second and fourth gate portions.

17. The device of claim 16, wherein the interfacial layer at the horizontal end portions has a thickness in a range of about 2 nanometers to about 3 nanometers.

18. The device of claim 16, wherein the dielectric wall structure has a width in a range of about 10 nanometers to about 100 nanometers.

19. The device of claim 16, further comprising a conductive layer on the first and second gate portions and on the third and fourth gate portions.

20. The device of claim 19, further comprising a gate isolation structure extending from an upper surface of the conductive layer to an upper surface of the wall structure.

* * * * *